(12) United States Patent
Jeon et al.

(10) Patent No.: US 12,616,014 B2
(45) Date of Patent: Apr. 28, 2026

(54) SEMICONDUCTOR DEVICE INCLUDING A THROUGH ELECTRODE CONTACTING A BACKSIDE CONDUCTIVE PATTERN AND A FRONTSIDE CONDUCTIVE PATTERN AND A SEMICONDUCTOR PACKAGE INCLUDING THE SAME

(71) Applicant: Samsung Electronics Co., Ltd., Suwon-si (KR)

(72) Inventors: Hyungjun Jeon, Seoul (KR); Kwangjin Moon, Hwaseong-si (KR); Myungjoo Park, Pohang-si (KR); Hakseung Lee, Seoul (KR); Sonkwan Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 837 days.

(21) Appl. No.: 17/713,421

(22) Filed: Apr. 5, 2022

(65) Prior Publication Data

US 2022/0367321 A1 Nov. 17, 2022

(30) Foreign Application Priority Data

May 11, 2021 (KR) ........................ 10-2021-0060685

(51) Int. Cl.
*H01L 23/48* (2006.01)
*H01L 23/00* (2006.01)
(Continued)

(52) U.S. Cl.
CPC ........ *H01L 23/481* (2013.01); *H01L 23/5226* (2013.01); *H01L 23/528* (2013.01);
(Continued)

(58) Field of Classification Search
CPC . H01L 23/481; H01L 23/5226; H01L 23/528; H01L 24/05; H01L 2224/05009;
(Continued)

(56) References Cited

U.S. PATENT DOCUMENTS 7,973,413 B2 7/2011 Kuo et al.
8,487,444 B2 7/2013 Law et al.
(Continued)

FOREIGN PATENT DOCUMENTS

JP 2013065615 * 4/2013
KR 10-2015-0058778 A 5/2015
(Continued)

OTHER PUBLICATIONS

Korean Office Action dated Mar. 10, 2025 for corresponding Korean Patent Application No. 10-2021-0060685 and its English-language translation.

*Primary Examiner* — Duy T Nguyen
*Assistant Examiner* — Pratiksha Jayant Lohakare
(74) *Attorney, Agent, or Firm* — HARNESS, DICKEY & PIERCE, P.L.C.

(57) ABSTRACT

A semiconductor device includes front and back side structures on first and second surfaces of a substrate, respectively, and first and second through electrodes penetrating the substrate. The front side structure includes a circuit device, a first front side conductive pattern at a first level, a second front side conductive pattern at a second level, a lower insulating structure, and first to third insulating structures. The back side structure includes a first and a second back side conductive pattern on the same level. The first through electrode contacts the first back side conductive pattern and the first front side conductive pattern. The second through electrode contacts the second back side conductive pattern and the second front side conductive pattern. The first front
(Continued)

side conductive pattern penetrates the second insulating structure and at least a portion of the third insulating structure.

20 Claims, 15 Drawing Sheets

(51) Int. Cl.
*H01L 23/522* (2006.01)
*H01L 23/528* (2006.01)

(52) U.S. Cl.
CPC .... *H01L 24/05* (2013.01); *H01L 2224/05009* (2013.01); *H01L 2224/05025* (2013.01)

(58) Field of Classification Search
CPC ......... H01L 2224/05025; H01L 23/522; H01L 23/5286; H01L 25/0657; H01L 21/76898; H01L 2225/06541; H01L 23/525; H01L 23/5382; H01L 23/5383; H01L 2225/06544
USPC ......................................................... 257/774
See application file for complete search history.

(56) References Cited

U.S. PATENT DOCUMENTS

| | | | |
|---|---|---|---|
| 8,501,587 B2 | 8/2013 | Chen et al. | |
| 9,142,490 B2 | 9/2015 | Park et al. | |
| 9,847,276 B2 | 12/2017 | Kang et al. | |
| 2002/0146859 A1* | 10/2002 | Akagawa | H01L 25/50 |
| | | | 438/622 |
| 2002/0175402 A1* | 11/2002 | McCormack | H01L 23/5389 |
| | | | 257/723 |
| 2002/0195700 A1* | 12/2002 | Li | H01J 9/326 |
| | | | 438/622 |
| 2005/0140021 A1* | 6/2005 | Wakisaka | H01L 25/03 |
| | | | 257/777 |
| 2010/0237499 A1* | 9/2010 | Kim | H01L 24/73 |
| | | | 257/784 |
| 2011/0193226 A1* | 8/2011 | Kirby | H01L 21/76898 |
| | | | 257/E21.585 |
| 2014/0048952 A1* | 2/2014 | Lee | H01L 24/03 |
| | | | 257/774 |
| 2015/0137388 A1 | 5/2015 | Kim et al. | |
| 2016/0300764 A1 | 10/2016 | Takeda et al. | |
| 2017/0005044 A1* | 1/2017 | Ishido | H01L 24/19 |
| 2019/0198426 A1* | 6/2019 | Choi | H01L 21/3212 |
| 2020/0066679 A1 | 2/2020 | Bohr et al. | |
| 2020/0105647 A1* | 4/2020 | Li | H01L 22/34 |
| 2020/0176380 A1 | 6/2020 | Chen et al. | |
| 2020/0273780 A1 | 8/2020 | Park et al. | |
| 2020/0312714 A1 | 10/2020 | Kirby et al. | |
| 2021/0020544 A1 | 1/2021 | Park et al. | |
| 2021/0183786 A1* | 6/2021 | Hong | H10D 30/6757 |

FOREIGN PATENT DOCUMENTS

| | | | |
|---|---|---|---|
| KR | 10-2021-0009719 A | 1/2021 | |
| WO | 2015/001662 A1 | 1/2015 | |

* cited by examiner

SEMICONDUCTOR DEVICE INCLUDING A THROUGH ELECTRODE CONTACTING A BACKSIDE CONDUCTIVE PATTERN AND A FRONTSIDE CONDUCTIVE PATTERN AND A SEMICONDUCTOR PACKAGE INCLUDING THE SAME

CROSS TO REFERENCE TO RELATED APPLICATION(S)

This application claims benefit of priority to Korean Patent Application No. 10-2021-0060685 filed on May 11, 2021 in the Korean Intellectual Property Office, the disclosure of which is incorporated herein by reference in its entirety.

BACKGROUND

Example embodiments of the present disclosure relate to a semiconductor device including a through electrode and a semiconductor package including the same.

Various techniques for forming a single semiconductor package by stacking a plurality of semiconductor devices have been studied. To electrically connect the plurality of stacked semiconductor devices to each other, a method using a through silicon via (TSV) penetrating through the semiconductor device has been suggested.

SUMMARY

An example embodiment of the present disclosure is to provide a semiconductor device having improved performance.

An example embodiment of the present disclosure is to provide a semiconductor package including a semiconductor device.

In an example embodiment of the present disclosure, a semiconductor device includes a semiconductor substrate having first and second surfaces opposing each other, a front side structure on the first surface of the semiconductor substrate, a back side structure below the second surface of the semiconductor substrate, a first through electrode penetrating through the semiconductor substrate, and a second through electrode penetrating through the semiconductor substrate. The front side structure includes a circuit device including a transistor, a first front side conductive pattern at a first level, a second front side conductive pattern at a second level lower than the first level, a lower insulating structure on the first surface of the semiconductor substrate, a first insulating structure including a first inter-metal dielectric layer having a first dielectric constant less than a dielectric constant of silicon oxide on the lower insulating structure, a second insulating structure including a second inter-metal dielectric layer having a second dielectric constant less than the first dielectric constant on the first insulating structure, and a third insulating structure on the second insulating structure. The first front side conductive pattern includes a first portion penetrating through the second insulating structure and a second portion penetrating through at least a portion of the third insulating structure. The back side structure includes a first back side conductive pattern and a second back side conductive pattern at a same level. The first through electrode contacts the first back side conductive pattern and the first portion of the first front side conductive pattern. The first through electrode includes a lower portion contacting the first back side conductive pattern and penetrating through the semiconductor substrate.

A first portion of the first through electrode penetrates through the lower insulating structure. A second portion of the first through electrode penetrates through the first insulating structure. The second through electrode contacts the second back side conductive pattern and the second front side conductive pattern.

In an example embodiment of the present disclosure, a semiconductor device includes a semiconductor substrate having first and second surfaces opposing each other, a front side structure on the first surface of the semiconductor substrate, a backside structure below the second surface of the semiconductor substrate, a first through electrode penetrating through the semiconductor substrate, and a second through electrode penetrating through the semiconductor substrate. The front side structure includes a circuit device including a transistor, a first front side conductive pattern at a first level, a second front side conductive pattern at a second level lower than the first level, and a plurality of circuit interconnection patterns at different levels. The second front side conductive pattern is level with a level of one of the plurality of circuit interconnection patterns. At least a portion of the first front side conductive pattern is level with levels of at least two of the plurality of circuit interconnection patterns. Two or more of the plurality of circuit interconnection patterns are disposed at a level higher than the first level of the first front side conductive pattern. The back side structure includes a first back side conductive pattern and a second back side conductive pattern at a same level. The first through electrode contacts the first back side conductive pattern and the first front side conductive pattern. The second through electrode contacts the second back side conductive pattern and the second front side conductive pattern. The second through electrode has a width narrower than a width of the first through electrode.

In an example embodiment of the present disclosure, a semiconductor package includes a base substrate, a first semiconductor device on the base substrate, a second semiconductor device on the first semiconductor device, first connection patterns electrically connecting the base substrate to the first semiconductor device, and second connection patterns electrically connecting the first semiconductor device to the second semiconductor device. The first semiconductor device includes a semiconductor substrate, a front side structure, a back side structure, a first through electrode, and a second through electrode. The semiconductor substrate has a first surface and a second surface opposing each other. The front side structure includes a circuit device including a transistor, a first front side conductive pattern at a first level, a second front side conductive pattern at a second level lower than the first level, a plurality of circuit interconnection patterns at different levels, a lower insulating structure on the first surface of the semiconductor substrate, a first insulating structure including a first inter-metal dielectric layer having a first dielectric constant less than a dielectric constant of silicon oxide on the lower insulating structure, a second insulating structure including a second inter-metal dielectric layer having a second dielectric constant less than the first dielectric constant on the first insulating structure, and a third insulating structure on the second insulating structure. A thickness of the first front side conductive pattern is greater than a thickness of the second front side conductive pattern. The back side structure is below the second surface of the semiconductor substrate. The back side structure includes a first back side conductive pattern and a second back side conductive pattern at a same level. The first front side conductive pattern is in contact with the first through electrode and penetrates through at least the second insulating structure. The first through electrode penetrates through the semiconductor substrate. The first through electrode contacts the first back side conductive pattern and the first front side conductive pattern. The first through electrode includes a lower portion in contact with the first back side conductive pattern. A first portion of the first through electrode penetrates through the lower insulating structure. A second portion of the first through electrode penetrates through the first insulating structure. The second through electrode penetrates through the semiconductor substrate. The second through electrode contacts the second back side conductive pattern and the second front side conductive pattern. A width of the second through electrode is narrower than a width of the first through electrode. The first connection patterns are between the base substrate and the first semiconductor device. The second connection patterns are between the first semiconductor device and the second semiconductor device.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments of the present disclosure will be described as follows with reference to the accompanying drawings.

Figure 1:
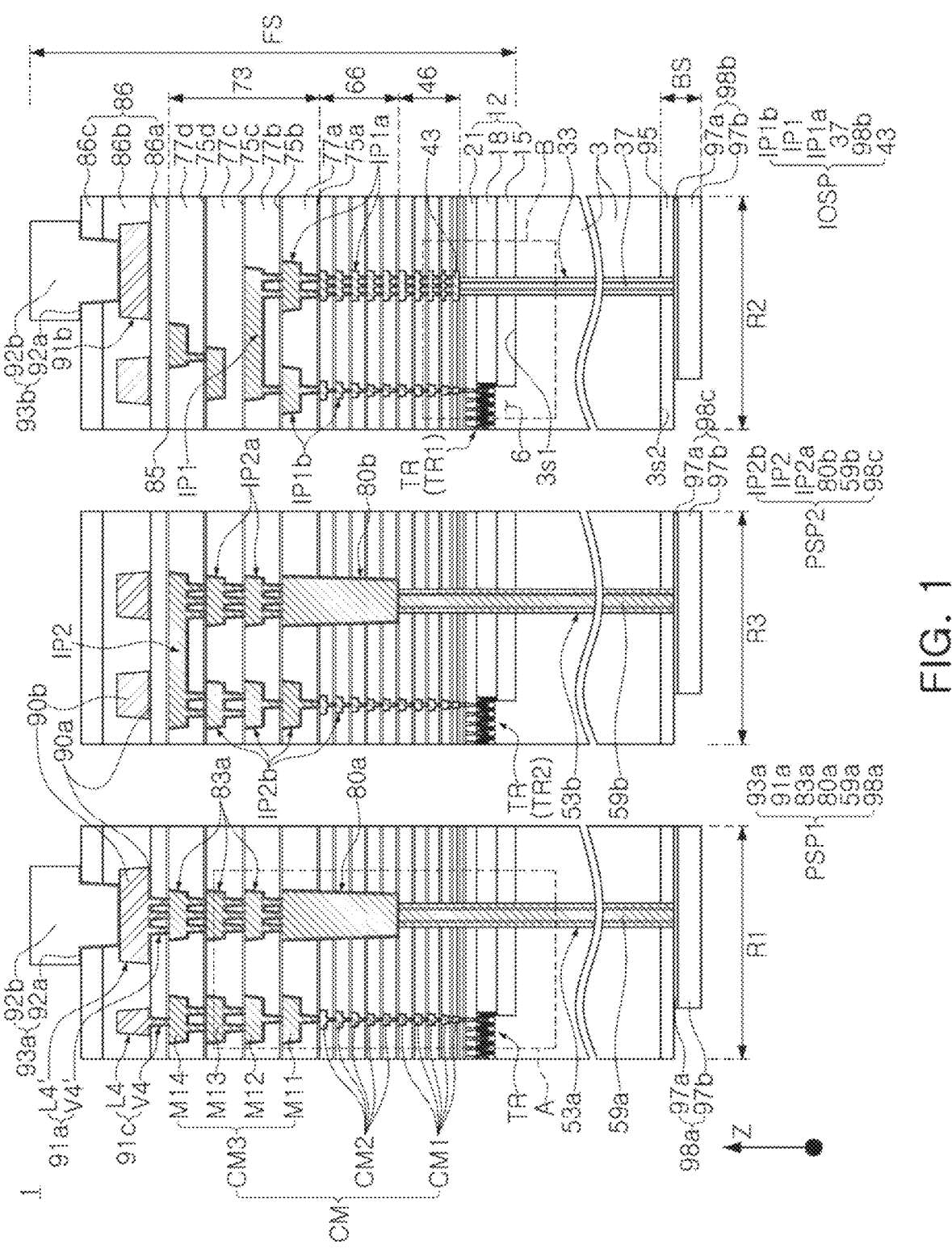
FIGS. 1, 2A, and 2B are diagrams illustrating a semiconductor device according to an example embodiment of the present disclosure.
Figure 2A:
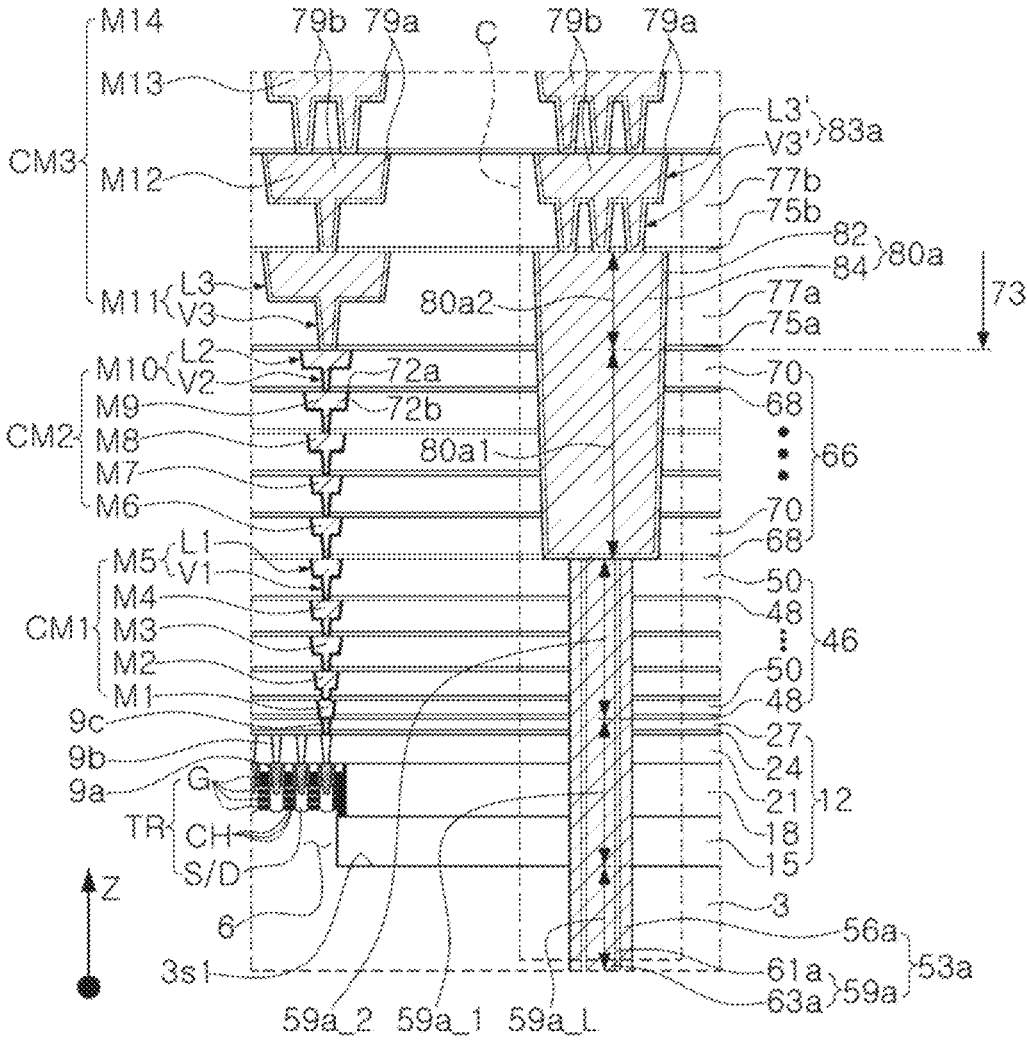
Figure 2B:
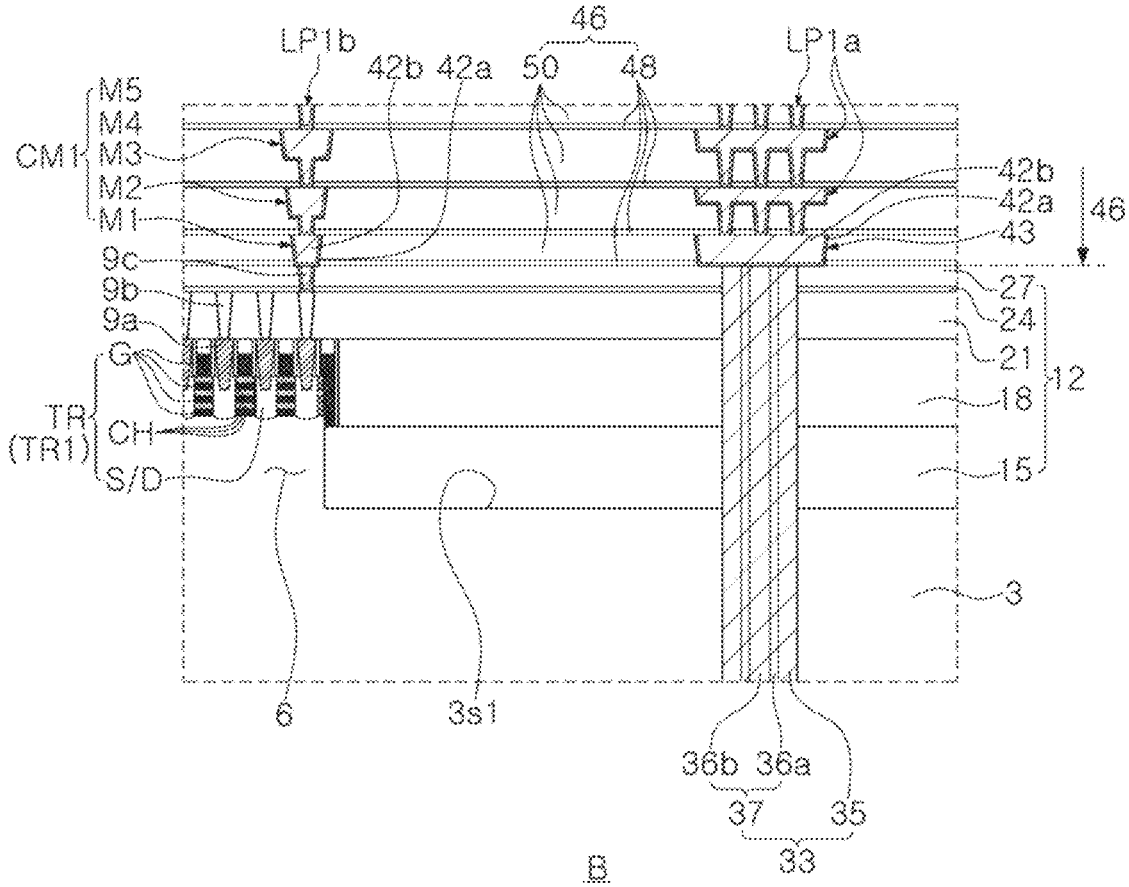

Referring to FIGS. 1, 2A and 2B, a semiconductor device 1 in an example embodiment may include a semiconductor substrate 3 having a first surface 3s1 and a second surface 3s2 opposing each other, a front side structure FS on the first surface 3s1 of the semiconductor substrate 3, and a back side structure BS below the second surface 3s2 of the semiconductor substrate 3.

The back side surface structure BS may include back side conductive patterns 98a, 98b, and 98c disposed below the second surface 3s2 of the semiconductor substrate 3, and a back side insulating layer 95 disposed between the second surface 3s2 of the semiconductor substrate 3 and the back side conductive patterns 98a, 98b, and 98c. The back side conductive patterns 98a, 98b, and 98c may include a first back side conductive pattern 98a, a second back side conductive pattern 98b, and a third back side conductive pattern 98c spaced apart from each other.

Each of the back side conductive patterns 98a, 98b, and 98c may include a first conductive layer 97a and a second conductive layer 97b disposed below the first conductive layer 97a. The second conductive layer 97b may include copper.

The front side structure FS may include a circuit device TR including a transistor and contact plugs 9a, 9b, and 9c electrically connected to the circuit device TR on the first surface 3s1 of the semiconductor substrate 3.

The circuit device TR may include a channel region CH on an active region 6, a gate structure G on the channel region CH, source/drain regions S/D on the active region 6 on the side of the gate structure G.

In an example, the channel region CH may include a plurality of channel layers stacked and spaced apart from each other in a vertical direction Z perpendicular to the first surface 3s1 of the semiconductor substrate 3, the gate structure G may be disposed to cross the plurality of channel layers and to surround each of the plurality of channel layers, and the plurality of channel layers of the channel region CH may be disposed between the source/drain regions S/D. Accordingly, the circuit device TR may include a transistor having a multi-bridge channel FET (MBCFET™) structure, which is a gate-all-around field effect transistor.

In another example, the circuit device TR may include a fin field effect transistor (FinFET) device, a MOSFET device having a vertical channel, or a planar MOSFET device.

The front side structure FS may further include a lower insulating structure 12 on the first surface 3s1 of the semiconductor substrate 3.

The lower insulating structure 12 may include a first lower insulating layer 15 limiting the active region 6, a second lower insulating layer 18 on the first lower insulating layer 15, and a third lower insulating layer 21 on the second lower insulating layer 18 and the circuit device TR. At least one of the first to third lower insulating layers 15, 18, and 21 may include silicon oxide. For example, each of the first to third lower insulating layers 15, 18, and 21 may be formed of silicon oxide.

The lower insulating structure 12 may further include a lower insulating barrier layer 24 on the third lower insulating layer 21 and a fourth lower insulating layer 27 on the lower insulating barrier layer 24.

The lower insulating barrier layer 24 may be a single layer or multiple layers. For example, the lower insulating barrier layer 24 may include at least one of AlN, SiCO, or SiCN. For example, the lower insulating barrier layer 24 may include a first layer and a second layer, one of the first and second layers may include AlN, and the other may include at least one of SiCO and SiCN.

In an example, the fourth lower insulating layer 27 may include a low-k material. In another example, the fourth lower insulating layer 27 may include silicon oxide.

The contact plugs 9a, 9b, and 9c electrically connected to the circuit device TR may include a first contact plug 9a electrically connected to the source/drain regions S/D or the gate structure G of the circuit device TR, a second contact plug 9b penetrating through the lower insulating layer 21 on the first contact plug 9a, and a third contact plug 9c penetrating through the lower insulating barrier layer 24 and the fourth lower insulating layer 27.

The front side structure FS may include a first insulating structure 46 on the lower insulating structure 12, a second insulating structure 66 on the first insulating structure 46, a third insulating structure 73 on the second insulating structure 66, and an upper insulating structure 86 on the third insulating structure 73. The front side structure FS may further include an upper insulating barrier layer 85 between the upper insulating structure 86 and the third insulating structure 73. The upper insulating barrier layer 85 may include SiCN or SiN.

The first insulating structure 46 may include first insulating barrier layers 48 and first inter-metal dielectric layers 50 alternately stacked on the lower insulating structure 12. The second insulating structure 66 may include second insulating barrier layers 68 and second inter-metal dielectric layers 70 alternately stacked. The third insulating structure 73 may include third insulating barrier layers 75a, 75b, 75c, and 75d and third inter-metal dielectric layers 77a, 77b, 77c, and 77d alternately stacked.

The first insulating structure 46 may have a thickness in a range of about 0.1 μm to about 0.5 μm.

The second insulating structure 66 may have a thickness greater than that of the first insulating structure 46. For example, the second insulating structure 66 may have a thickness in a range of about 0.5 μm to about 1 μm.

The third insulating structure 73 may have a thickness greater than that of the second insulating structure 66.

Each of the first insulating barrier layers 48 may include at least one of AlN, SiCO, or SiCN. For example, each of the first insulating barrier layers 48 may include a first layer and a second layer, at least one of the first and second layers may include AlN, and the other may include at least one of SiCO and SiCN.

Each of the first insulating barrier layers 48 may have a thickness of about 3 nm to about 10 nm.

The first inter-metal dielectric layers 50 may include a first material having a first dielectric constant smaller than that of silicon oxide. The first material may be a low-k dielectric. For example, the dielectric constant value of the first material may be in a range of about 2.5 to 2.7. The dielectric constant of the silicon oxide may be about 3.9 to about 4.2, but depending on a method of forming the silicon oxide, the dielectric constant of the silicon oxide may be less than 3.9 or greater than 4.2.

A thickness of each of the first inter-metal dielectric layers 50 may be greater than a thickness of each of the first insulating barrier layers 48.

The second insulating barrier layers 68 may include a SiCN material.

A thickness of one of the second insulating barrier layers 68 may be greater than a thickness of one of the first insulating barrier layers 48.

Each of the second insulating barrier layers 68 may have a thickness of about 50 nm and about 150 nm.

The second inter-metal dielectric layers 70 may include a second material having a second dielectric constant smaller than the first dielectric constant. The second material may be an ultra-low-k dielectric. For example, the second dielectric constant value of the second material may be greater than 1 and less than about 2.5. For example, the second material may be a silica-based insulating material, such as, for example, a SiCOH material or a fluorinated silica glass (FSG) material. A thickness of each of the second inter-metal dielectric layers 70 may be greater than a thickness of each of the second insulating barrier layers 68.

A thickness of an uppermost second inter-metal dielectric layer of the second inter-metal dielectric layers 70 may be greater than a thickness of one of the first inter-metal dielectric layers 50.

The third insulating barrier layers 75a, 75b, 75c, and 75d may include SiCN or SiN. Each of the third inter-metal dielectric layers 77a, 77b, 77c, and 77d may include a third material having a third dielectric constant greater than the first dielectric constant of the first material of the first inter-metal dielectric layers 50. For example, each of the third inter-metal dielectric layers 77a, 77b, 77c, and 77d may be formed of silicon oxide. A thickness of each of the third inter-metal dielectric layers 77a, 77b, 77c, and 77d may be greater than a thickness of each of the third insulating barrier layers 75a, 75b, 75c and 75d.

A thickness of one of the third inter-metal dielectric layers 77a, 77b, 77c, and 77d, a thickness of a lowermost third inter-metal dielectric layer 77a, for example, may be in the range of about 0.5 μm to about 1.5 μm.

A thickness of the lowermost third inter-metal dielectric layer 77a may be greater than a thickness of the first insulating structure 46.

A thickness of the lowermost third inter-metal dielectric layer 77a may be equal to or greater than a thickness of the second insulating structure 66.

A thickness of one of the third inter-metal dielectric layers 77a, 77b, 77c, and 77d may be greater than a thickness of one of the second inter-metal dielectric layers 70. Each of the third inter-metal dielectric layers 77a, 77b, 77c, and 77d may have a thickness greater than a thickness of each of the second inter-metal dielectric layers 70.

A thickness of an uppermost second inter-metal dielectric layer of the second inter-metal dielectric layers 70 may be greater than a thickness of an uppermost first inter-metal dielectric layer 50 of the first inter-metal dielectric layers 50.

The upper insulating structure 86 may include a first upper insulating layer 86a, a second upper insulating layer 86b, and a third upper insulating layer 86c stacked in order. The first upper insulating layer 86a and the second upper insulating layer 86b may be formed of a material having a dielectric constant greater than the first dielectric constant, such as, for example, silicon oxide. The third upper insulating layer 86c may be formed of a material having a dielectric constant higher than that of the first upper insulating layer 86a and the second upper insulating layer 86b, such as, for example, silicon nitride. The third upper insulating layer 86c may be formed of a passivation material which may protect the semiconductor device 1 rather than silicon nitride.

The front side structure FS may include circuit interconnection structures CM and 91c.

The circuit interconnection structures CM and 91c may include a lower circuit interconnection structure CM including a first circuit interconnection structure CM1, a second circuit interconnection structure CM2 on the first circuit interconnection structure CM1, and a third circuit interconnection structure CM3 on the second circuit interconnection structure CM2, and an upper circuit interconnection pattern 91c on the lower circuit interconnection structure CM.

The first circuit interconnection structure CM1 may be disposed in the first insulating structure 46 and may include a plurality of circuit interconnection patterns disposed on different levels. For example, the first circuit interconnection structure CM1 may include first, second, third, fourth, and fifth circuit interconnection patterns M1, M2, M3, M4 and M5 disposed on different levels. Each of the second, third, fourth and fifth circuit interconnection patterns M2, M3, M4, and M5 among the first, second, third, fourth, and fifth circuit interconnection patterns M1, M2, M3, M4 and M5 may include a via portion V1 and an interconnection portion L1 extending from the via portion V1 on the via portion V1, and the first circuit interconnection pattern M1 may configured as an interconnection portion.

In example embodiments, the term "level" may be a term used to compare relative positions when viewed with reference to the cross-sectional structures in the drawings. Therefore, in the description below, the term "level" may be understood based on the cross-sectional structures in the drawings, unless otherwise indicated.

Each of the first, second, third, fourth and fifth circuit interconnection patterns M1, M2, M3, M4, and M5 may include a conductive material pattern 42b and a conductive barrier layer 42a covering a side surface and a bottom surface of the conductive material pattern 42b. The conductive material pattern 42b may include a copper material.

Each of the first, second, third, fourth and fifth circuit interconnection patterns M1, M2, M3, M4, and M5 may penetrate one of the first insulating barrier layers 48 and one of the first inter-metal dielectric layers 50 stacked in order. For example, one of the first, second, third, fourth, and fifth circuit interconnection patterns M1, M2, M3, M4, and M5 may penetrate the first inter-metal dielectric layer 50 and the first insulating barrier layer 48 in contact with the first inter-metal dielectric layer 50.

The second circuit interconnection structure CM2 may include a plurality of circuit interconnection patterns disposed on different levels. The second circuit interconnection structure CM2 may be disposed in the second insulating structure 66, and may include a plurality of circuit interconnection patterns disposed on different levels. For example, the second circuit interconnection structure CM2 may include sixth, seventh, eighth, ninth, and tenth circuit interconnection patterns M6, M7, M8, M9, and M10 disposed on different levels. Each of the sixth, seventh, eighth, ninth and tenth circuit interconnection patterns M6, M7, M8, M9, and M10 may include a via portion V2 and an interconnection portion L2 extending from the via portion V2 on the via portion V2.

Each of the sixth, seventh, eighth, ninth and tenth circuit interconnection patterns M6, M7, M8, M9, and M10 may include a conductive material pattern 72b and a conductive barrier layer 72a covering a side surface and a bottom surface of the conductive material pattern 72b. The conductive material pattern 72b may include a copper material.

Each of the sixth, seventh, eighth, ninth and tenth circuit interconnection patterns M6, M7, M8, M9, and M10 may penetrate one of the second insulating barrier layers 68 and one of the second inter-metal dielectric layers 70 stacked in order. For example, one of the sixth, seventh, eighth, ninth, and tenth circuit interconnection patterns M6, M7, M8, M9, and M10 may include the second inter-metal dielectric layer 70 and the second insulating barrier layer 68 in contact with a lower surface of the second inter-metal dielectric layer 70.

The third circuit interconnection structure CM3 may include a plurality of circuit interconnection patterns disposed on different levels. The third circuit interconnection structure CM3 may be disposed in the third insulating structure 73 and may include a plurality of circuit interconnection patterns disposed on different levels. For example, the third circuit interconnection structure CM3 may include eleventh, twelfth, thirteenth, and fourteenth circuit interconnection patterns M11, M12, M13, and M14 disposed on different levels. Each of the eleventh, twelfth, thirteenth and fourteenth circuit interconnection patterns M11, M12, M13, and M14 may include a via portion V3 and an interconnection portion L3 extending from the via portion V3 on the via portion V3.

Each of the eleventh, twelfth, thirteenth and fourteenth circuit interconnection patterns M11, M12, M13, and M14 may include a conductive material pattern 79b and a conductive barrier layer 79a covering a side surface and a bottom surface of the conductive material pattern 79b. The conductive material pattern 79b may include a copper material.

Each of the eleventh, twelfth, thirteenth, and fourteenth circuit interconnection patterns M11, M12, M13, and M14 may penetrate one of the third insulating barrier layers 75a, 75b, 75c, and 75d and one of the third inter-metal dielectric layers 77a, 77b, 77c, and 77d stacked in order. For example, the eleventh circuit interconnection pattern M11 among the eleventh, twelfth, thirteenth, and fourteenth circuit interconnection patterns M11, M12, M13, and M14 may penetrate the third insulating barrier layer 75a and the third inter-metal dielectric layer 77a stacked in order.

The upper circuit interconnection pattern 91c may include a via portion V4 penetrating through the first upper insulating layer 86a and an interconnection portion L4 extending from the via portion V4 and disposed on the first upper insulating layer 86a. The upper circuit interconnection pattern 91c may include a conductive material pattern 90b and a conductive barrier layer 90a covering a bottom surface of the conductive material pattern 90b. The conductive material pattern 90b may include aluminum. The second upper insulating layer 86b may cover an upper surface and a side surface of the interconnection portion L4 of the upper circuit interconnection pattern 91c.

A slope of a side surface of the interconnection portion L4 of the upper circuit interconnection pattern 91c may be different from a slope of a side surface of each of the interconnection portions L1, L2, and L3 of the lower circuit interconnection structure CM. For example, the side surface of the interconnection portion L4 of the upper circuit interconnection pattern 91c may have a positive slope, and a side surface of each of the interconnection portions L1, L2, and L3 of the lower circuit interconnection structure CM may have a negative slope. The positive slope of the side surface may refer to a slope of the side surface of which a width decreases from a lower surface towards an upper surface, and the negative slope of the side surface may refer to a slope of the side surface of which a width increases from the lower surface towards the upper surface.

The front side structure FS may further include a plurality of front side conductive patterns. The plurality of front side conductive patterns may include a first front side conductive pattern 80*a* and a third front side conductive pattern 80*b* disposed at a first level on the first surface 3*s*1 of the semiconductor substrate 3, and a second front side conductive pattern 43 disposed on a level lower than the first level. Since the third front side conductive pattern 80*b* may be formed of the same material as that of the first front side conductive pattern 80*a* and may have the same structure as that of the first front side conductive pattern 80*a*, the description of the first front side conductive pattern 80*a* may be applied to the third front side conductive pattern 80*b*.

The second front side conductive pattern 43 may be disposed on substantially the same level as a level of one of the first to fifth circuit interconnection patterns M1-M5. For example, the second front side conductive pattern 43 may be disposed on substantially the same level as a level of the first circuit interconnection pattern M1. The second conductive pattern 43 may be formed of substantially the same material as that of the first circuit interconnection pattern M1. For example, the second conductive pattern 43 may include a conductive material pattern 42*b* and a conductive barrier layer 42*a* covering a side surface and a bottom surface of the conductive material pattern 42*b*. The second conductive pattern 43 may penetrate a lowermost first insulating barrier layer 48 and a lowermost first inter-metal dielectric layer 50 stacked in order in the first insulating structure 46.

The first front side conductive pattern 80*a* may have a thickness greater than that of the second front side conductive pattern 43. At least a portion of the first front side conductive pattern 80*a* may be disposed on the same level as levels of at least two circuit interconnection patterns of the lower circuit interconnection structure CM. For example, the first front side conductive pattern 80*a* may include a first portion 80*a*1 disposed on the same level as a level of the second circuit interconnection structure CM2 and a second portion 80*a*2 disposed on substantially the same level as a level of at least a portion of the third circuit interconnection structure CM3. In the first front side conductive pattern 80*a*, the first portion 80*a*1 may be disposed on substantially the same level as a level of the second insulating structure 66, and the second portion 80*a*2 may be disposed on substantially the same level as a level of a portion of the third insulating structure 73, a lowermost third insulating barrier layer 75*a* and a lowermost third inter-metal dielectric layer 77*a*, for example. In the first front side conductive pattern 80*a*, the second portion 80*a*2 may be disposed on substantially the same level as the eleventh circuit interconnection pattern M11 of the third circuit interconnection structure CM3.

The front side structure FS may further include a plurality of through electrode structures. The plurality of through electrode structures may include a first through electrode structure 53*a* including a first through electrode 59*a*, a second through electrode structure 33 including a second through electrode 37, and a third through electrode 53*b* including a third through electrode 53*b*. The first through electrode structure 53*a* may be disposed in the first region R1 of the semiconductor device 1, the second through electrode structure 33 may be disposed in the second region R2 of the semiconductor device 1, and the third through electrode structure 53*b* may be disposed in the third region R3 of the semiconductor device 1.

The first through electrode structure 53*a* may further include a first insulating spacer 56*a* surrounding a side surface of the first through electrode 59*a*, and the second through electrode structure 33 may further include a second insulating spacer 35 surrounding the side surface of the second through electrode 37. The third through electrode structure 53*b* may be formed of the same material as that of the first through electrode structure 53*a* and may have the same structure as the first through electrode structure 53*a*.

The first through electrode structure 53*a* may have an upper surface penetrating through the semiconductor substrate 3, the lower insulating structure 12, and the first insulating structure 46 and in contact with the first front side conductive pattern 80*a*, and a lower surface in contact with the first back side conductive pattern 98*a*. An entire upper surface of the first through electrode 59*a* may be in contact with the first front side conductive pattern 80*a*.

The first through electrode 59*a* may include a lower portion 59*a*_L (in FIG. 2A) in contact with the first back side conductive pattern 98*a*, extending in the vertical direction Z, and penetrating through the semiconductor substrate 3, a first portion 59*a*_1 extending from the lower portion 59*a*_L in the vertical direction Z and penetrating through the lower insulating structure 12, and a second portion 59*a*_2 extending from the first portion 59*a*_1 in the vertical direction Z and penetrating through the first insulating structure 46. The first through electrode 59*a* may include a pillar pattern 63*a* and a conductive barrier layer 61*a* surrounding a side surface of the pillar pattern 63*a*. The second through electrode 37 may include a pillar pattern 36*b* and a conductive barrier layer 36*a* surrounding a side surface of the pillar pattern 36*b*. The pillar patterns 63*a* and 36*b* may include copper, but an example embodiment thereof is not limited thereto, and the pillar patterns 63*a* and 36*b* may include other conductive materials.

The vertical direction Z may be perpendicular to the first surface 3*s*1 of the semiconductor substrate 3, and may be directed from the second surface 3*s*2 of the semiconductor substrate 3 to the first surface 3*s*1.

The second through electrode structure 33 may have an upper surface penetrating through the semiconductor substrate 3 and the lower insulating structure 12 and in contact with the second front side conductive pattern 43, and a lower surface in contact with the conductive pattern 98*b*. An entire upper surface of the second through electrode 37 may be in contact with the second front side conductive pattern 43. The second through electrode 37 may be in contact with the second back side conductive pattern 98*b*, may extend in the vertical direction Z, and may penetrate the semiconductor substrate 3 and the lower insulating structure 12.

The width of the second through electrode 37 may be in a range of about 2.5 μm to about 7 μm.

The first through electrode 59*a* may have a width greater than that of the second through electrode 37 in a range of about 3.5 μm to about 9 μm.

The front side structure FS may include first lower connection patterns 83*a* disposed on different levels on the first front side conductive pattern 80*a* and a first upper connection pattern 91*a* on the first lower connection patterns 83*a*.

The first lower connection patterns 83*a* may have a structure in which two or more lower connection patterns are stacked in order. For example, the first lower connection patterns 83*a* may be disposed on the same level as levels of the twelfth, thirteenth, and fourteenth circuit interconnection patterns M12, M13, and M14 of the third circuit interconnection structure CM3.

Each of the first lower connection patterns 83*a* may have a structure similar to that of the twelfth, thirteenth and fourteenth circuit interconnection patterns M12, M13, and M14. For example, each of the first lower connection patterns 83a may have a via portion V3' and a connection portion L3' extending from the via portion V3' on the via portion V3'.

The via portion V3' may be plural in each of the first lower connection patterns 83a. For example, a lowermost first lower connection pattern among the first lower connection patterns 83a may include a plurality of via portions V3' in contact with the first front side conductive pattern 80a, and a connection portion L3' extending from the plurality of via portions V3'.

Each of the first lower connection patterns 83a may be formed of the same material as that of the twelfth, thirteenth and fourteenth circuit interconnection patterns M12, M13, and M14, such as, for example, the conductive material pattern 79b and the conductive barrier layer 79a covering a side surface and a bottom surface of the conductive material pattern 79b.

The first upper connection pattern 91a may be disposed on substantially the same level as a level of the upper circuit interconnection pattern 91c. The first upper connection pattern 91a may include one or more of via portions V4' in contact with an uppermost first connection pattern among the first lower connection patterns 83a, and a connection portion L4' extending from the one or more of via portions V4'. The first upper connection pattern 91a may be formed of the same material as that of the upper circuit interconnection pattern 91c, such as, for example, the conductive material pattern 90b and the conductive barrier layer 90a covering a lower surface of the conductive material pattern 90b.

The side surface of the interconnection portion L4 of the upper circuit interconnection pattern 91c may have a positive slope, and the side surface of each of the interconnection portions L1, L2, and L3 of the lower circuit interconnection structure CM may have a negative slope.

The side surface of the connection portion L4' of the first upper connection pattern 91a and the side surface of the connection portion L3' of each of the first lower connection patterns 83a may have different slopes. For example, the side surface of the connection portion L4' of the first upper connection pattern 91a may have a positive slope, and the side surface of the connection portion L3' of each of the first lower connection patterns 83a may have a negative slope.

The front side structure FS may further include a second upper connection pattern 91b. The second upper connection pattern 91b may be electrically connected to the circuit device TR.

The front side structure FS may further include a first front side pad 93a penetrating through a portion of the upper insulating structure 86 and in contact with the first upper connection pattern 91a, and a second front side pad 93a in contact with the second upper connection pattern 91b. Each of the first and second front side pads 93a and 93b may include a liner layer 92a and a pad pattern 92b on the liner layer 92a. The pad pattern 92b may be configured as a conductive bump. For example, the pad pattern 92b may include at least one of copper, nickel, gold, and solder. A width of each of the first and second front side pads 93a and 93b may be smaller than a width of each of the first to third lower conductive patterns 98a, 98b, and 98'.

The second front side conductive pattern 43 may be disposed on the same level as a level of one of the circuit interconnection patterns M1 of the plurality of circuit interconnection patterns, at least a portion of the first front side conductive pattern 80a may be disposed on the same level as a level of at least two of the plurality of circuit interconnection patterns, levels of the sixth to eleventh circuit interconnection patterns M6-M11, for example, and two or more of the circuit interconnection pattern disposed on a level higher than the level of the first front side conductive pattern 80a may be disposed, which may be the twelfth to fourteenth circuit interconnection patterns M12-M14 and the upper circuit interconnection pattern 91c.

The first back side conductive pattern 98a, the first through electrode 59a, the first front side conductive pattern 80a, the first connection patterns 83a, and the first upper connection pattern 91a, and the first front side pad 93a may be arranged in order in the vertical direction Z and may overlap each other.

The first back side conductive pattern 98a, the first through electrode 59a, the first front side conductive pattern 80a, the first connection patterns 83a, the first upper connection pattern 91a, and the first front side pad 93a may form a first power path PSP1.

By forming a plurality of the first power paths PSP1, heat dissipation properties of the semiconductor device 1 may improve.

The front side structure FS may include one or more of second connection patterns IP1a on the second front side conductive pattern 43, a first circuit interconnection structure IP1b of the circuit interconnection structures CM and 91c, and a first bridge pattern IP1 electrically connecting the one or more of second lower connection patterns IP1a to the first circuit interconnection structure IP1b on the one or more of second lower connection patterns IP1a and the first circuit interconnection structure IP1b.

In FIG. 1, the first bridge pattern IP1 may be disposed on the same level as a level of the twelfth circuit interconnection pattern M12, but an example embodiment thereof is not limited thereto. For example, the first bridge pattern IP1 may be disposed on the same level as a level of one of the third to fourteenth circuit interconnection patterns M3-M11. For example, when the first bridge pattern IP1 is disposed on the same level as a level of the third circuit interconnection pattern M3, the one or more of second lower connection patterns IP1a may be configured as one of the second connection patterns IP1a formed the same as the second circuit interconnection pattern M2 on the same level as a level of the second circuit interconnection pattern M2. When the first bridge pattern IP1 is disposed on the same level as a level of the fourteenth circuit interconnection pattern M14, the one or more of second lower connection patterns IP1a may be configured as connection patterns formed the same as the second to thirteenth circuit interconnection patterns M2-M13 on the same level as the levels of the second to thirteenth circuit interconnection patterns M2-M13.

The second back side conductive pattern 98b, the second through electrode 37, the second front side conductive pattern 43, the one or more of second lower connection patterns IP1a, the first bridge pattern IP1 and the first circuit interconnection structure IP1b may form an input/output signal path IOSP. The input/output signal path IOSP may be electrically connected to the circuit device TR1 of the circuit device TR.

The front side structure FS may include one or more of third lower connection patterns IP2a on the third front side conductive pattern 80b, a second circuit interconnection structure IP2b of the circuit interconnection structures CM, a second bridge pattern IP2 electrically connecting the one or more of third lower connection patterns IP2a to the second circuit interconnection structure IP2b on the one or more of third lower connection patterns IP2a to the second circuit interconnection structure IP2b.

In FIG. 1, the second bridge pattern IP2 may be disposed on the same level as a level of the fourteenth circuit interconnection pattern M14, but an example embodiment thereof is not limited thereto. For example, the second bridge pattern IP2 may be disposed on the same level as a level of one of the twelfth and thirteenth circuit interconnection patterns M12 and M13. When the second bridge pattern IP2 is disposed on the same level as a level of the twelfth circuit interconnection pattern M12, the one or more of third connection patterns IP2a may not be provided, and the second bridge pattern IP2 may be in direct contact with the third front side conductive pattern 80*b*.

The third back side conductive pattern 98*c*, the third through electrode 59*b*, the third front side conductive pattern 80*b*, the one or more of third lower connection patterns IP2a, the second bridge pattern IP2 and the second circuit interconnection structure IP2b may form a second power path PSP2. The second power path PSP2 may be electrically connected to the circuit device TR2 of the circuit device TR. Power may be transmitted through the first and second power paths PSP1 and PSP2.

In the description below, various modified examples of the semiconductor device 1 in an example embodiment will be described with reference to FIGS. 3A, 3B, 4, 5, 6 and 7. Among the components of the semiconductor device 1, the components which may be modified or replaced will be mainly described, and the other components will not be described or will be described along with the components modified by being directly referred to. In FIGS. 3A, 3B, 4, 5, 6, and 7, FIGS. 3A and 3B are enlarged diagrams illustrating a portion of the components modified from the example in FIG. 2A, FIG. 4 is an enlarged diagram illustrating a modified example of region 'C' in FIG. 2A, and FIGS. 5, 6, and 7 are cross-sectional diagrams illustrating components modified from the example in FIG. 1.

Figure 3A:
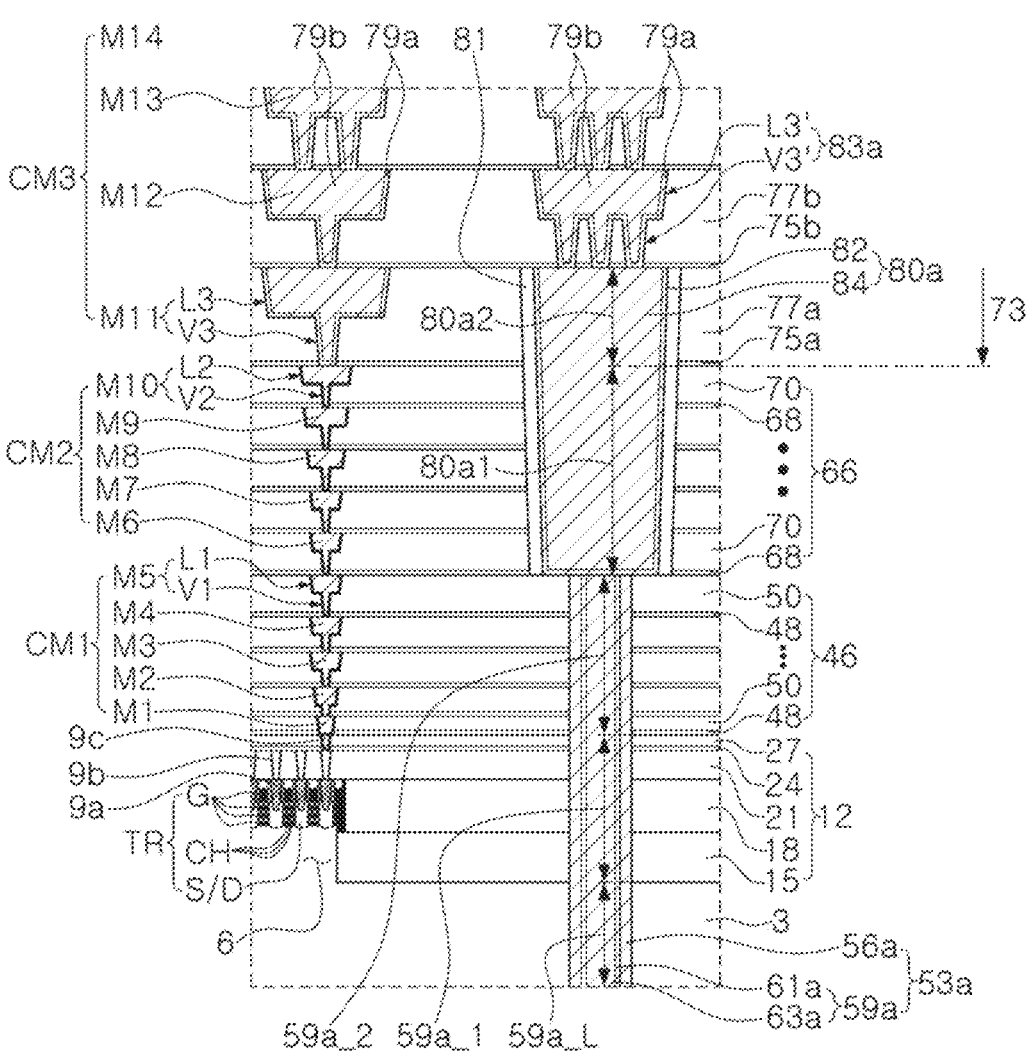
FIG. 3A is an enlarged diagram illustrating a portion of a semiconductor device according to an example embodiment of the present disclosure.
Figure 4:
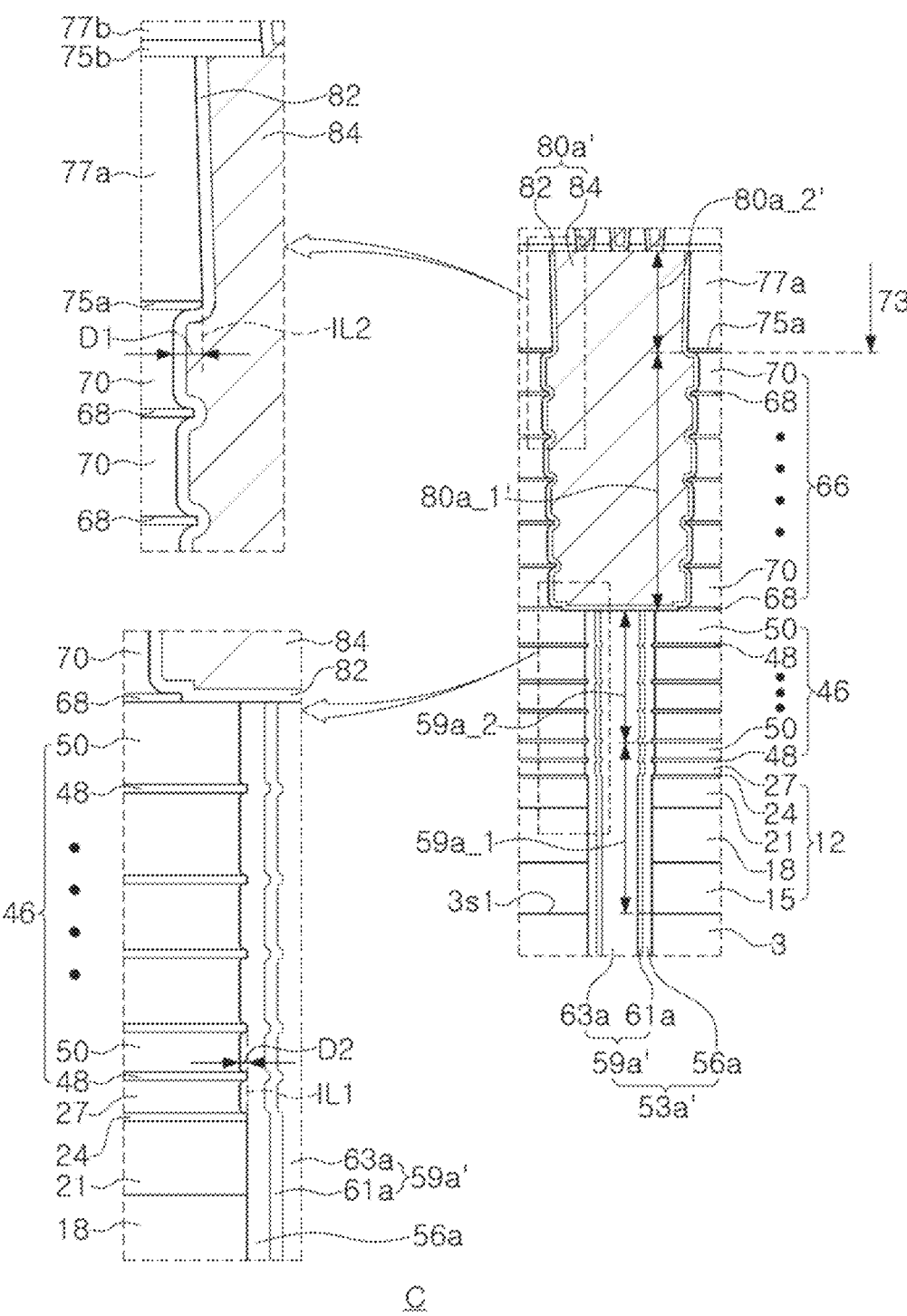
FIG. 4 is an enlarged diagram illustrating a portion of a semiconductor device according to an example embodiment of the present disclosure.

In the modified example, referring to FIG. 3A, an insulating spacer 81 surrounding a side surface of the first front side conductive pattern 80*a* as in FIG. 2A may be disposed. The insulating spacer 81 may include silicon oxide. Accordingly, the insulating spacer 81 may separate the first front side conductive pattern 80*a* from the second insulating structure 66.

Figure 3B:
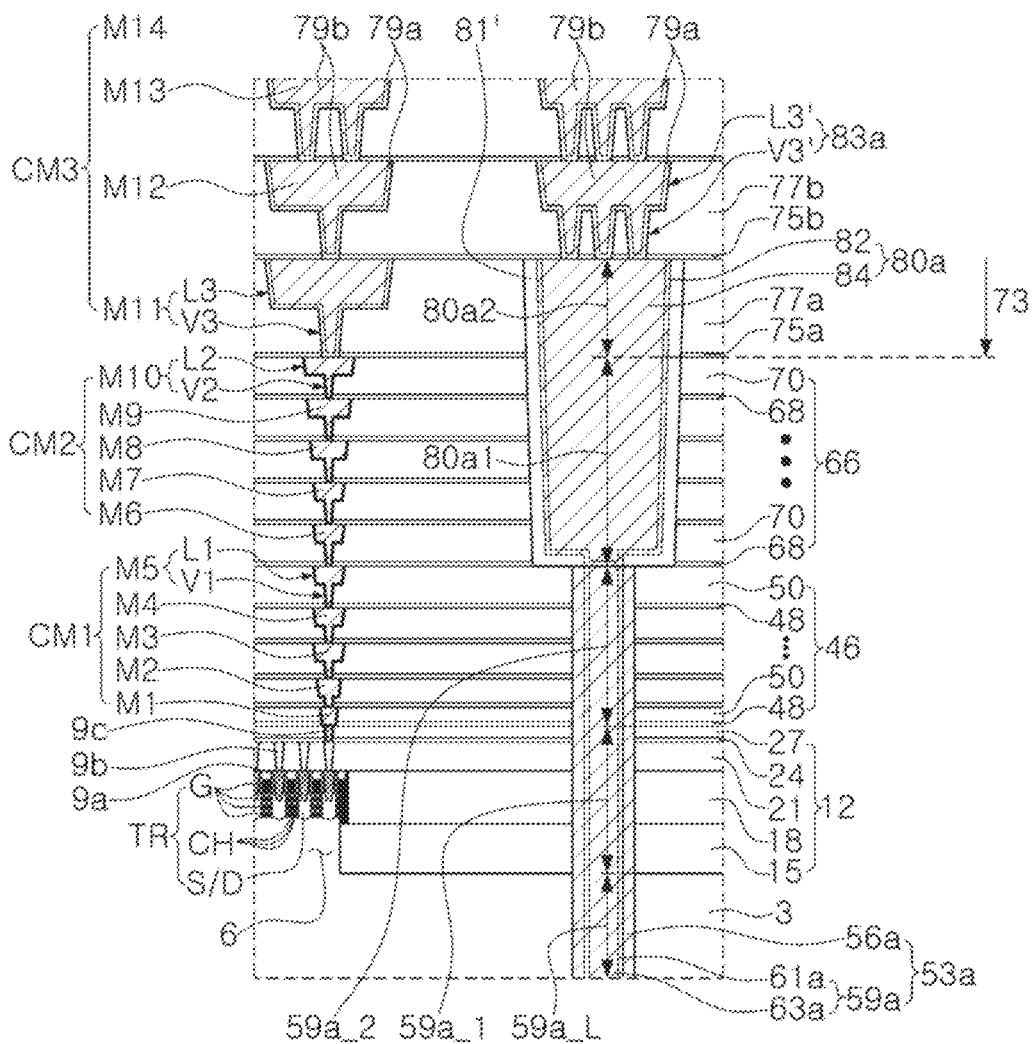
FIG. 3B is an enlarged diagram illustrating a portion of a semiconductor device according to an example embodiment of the present disclosure.

In the modified example, referring to FIG. 3B, an insulating spacer 81' surrounding a side surface of the first front side conductive pattern 80*a* and covering a portion of a lower surface of the first front side conductive pattern 82*a* may be disposed. The insulating spacer 81' may include silicon oxide. The insulating spacer 81' covering a portion of the lower surface of the first front side conductive pattern 82*a* may be in contact with the insulating spacer 56*a* covering a side surface of the first through electrode 59*a*.

In the modified example, referring to FIG. 4, a first through electrode structure and a first front side conductive pattern 80*a'* which may replace the first through electrode structure 53*a* (in FIG. 2A) and the first front side conductive pattern 80*a* (in FIG. 2A) described above, respectively, may be disposed. The first through electrode structure 53*a'* may include a through electrode 59*a'* and an insulating spacer 56*a* covering a side surface of the through electrode 59*a'*, and the through electrode 59*a'* may include a conductive barrier layer 61*a* surrounding the side surface of the pillar pattern 63*a*.

The first through electrode 59*a'* may include a first portion 59*a*_1 extending in the vertical direction Z from the lower portion 59*a*_L and penetrating through the lower insulating structure 12, and a second portion 59*a*_2 extending from the portion 59*a*_1 in the vertical direction Z and penetrating through the first insulating structure 46.

A first front side conductive pattern 80*a'* which may replace the first front side conductive pattern 80*a* (in FIG. 2A) described above may be disposed. The first front side conductive pattern 80*a'* may include a first portion 80*a*_1' disposed on the same level as a level of the second circuit interconnection structure CM2, and a second portion 80*a*_2' disposed on substantially the same level as a level of at least a portion of the third circuit interconnection structure CM3. In the first front side conductive pattern 80*a'*, the first portion 80*a*_1' may be disposed on substantially the same level as a level of the second insulating structure 66, and the second portion 80*a*_2' may be disposed on substantially the same level as a level of a portion of the third insulating structure 73, a lowermost third insulating barrier layer 75*a* and a lowermost third inter-metal dielectric layer 77*a*.

At least one of the second inter-metal dielectric layers 70 may be recessed by a first distance D1 from an imaginary straight line IL2 extending from a side surface of the third inter-metal dielectric layer 77*a* adjacent to the first front side conductive pattern 80*a'* among the third inter-metal dielectric layers 77*a*, 77*b*, 77*c*, and 77*d*.

At least one of the first inter-metal dielectric layers 50 may be recessed by a second distance D2 from an imaginary straight line IL1 extending from side surfaces of the first to third lower insulating layers 15, 18, and 21 of the lower insulating structure 12 adjacent to the first through electrode 59*a'*.

When the fourth lower insulating layer 27 is formed of the same material as that of the first inter-metal dielectric layers 50, the fourth lower insulating layer 27 may be recessed by the second distance D2 from the imaginary straight line ILE The first distance D1 may be greater than the second distance D2.

The first distance D1 may be in a range of about 100 nm to about 300 nm.

The second distance D2 may be in a range of about 10 nm to about 50 nm.

Since the first inter-metal dielectric layers 50 may be recessed by the second distance D2, and the second inter-metal dielectric layers 70 may be recessed by the first distance D1, a width of the first through electrode 59*a'* and a width of the first front side conductive pattern 80*a'* may increase. Accordingly, as resistance properties of the first through electrode 59*a'* and the first front side conductive pattern 80*a'* improve, electrical properties of the semiconductor device 1 may improve.

Figure 5:
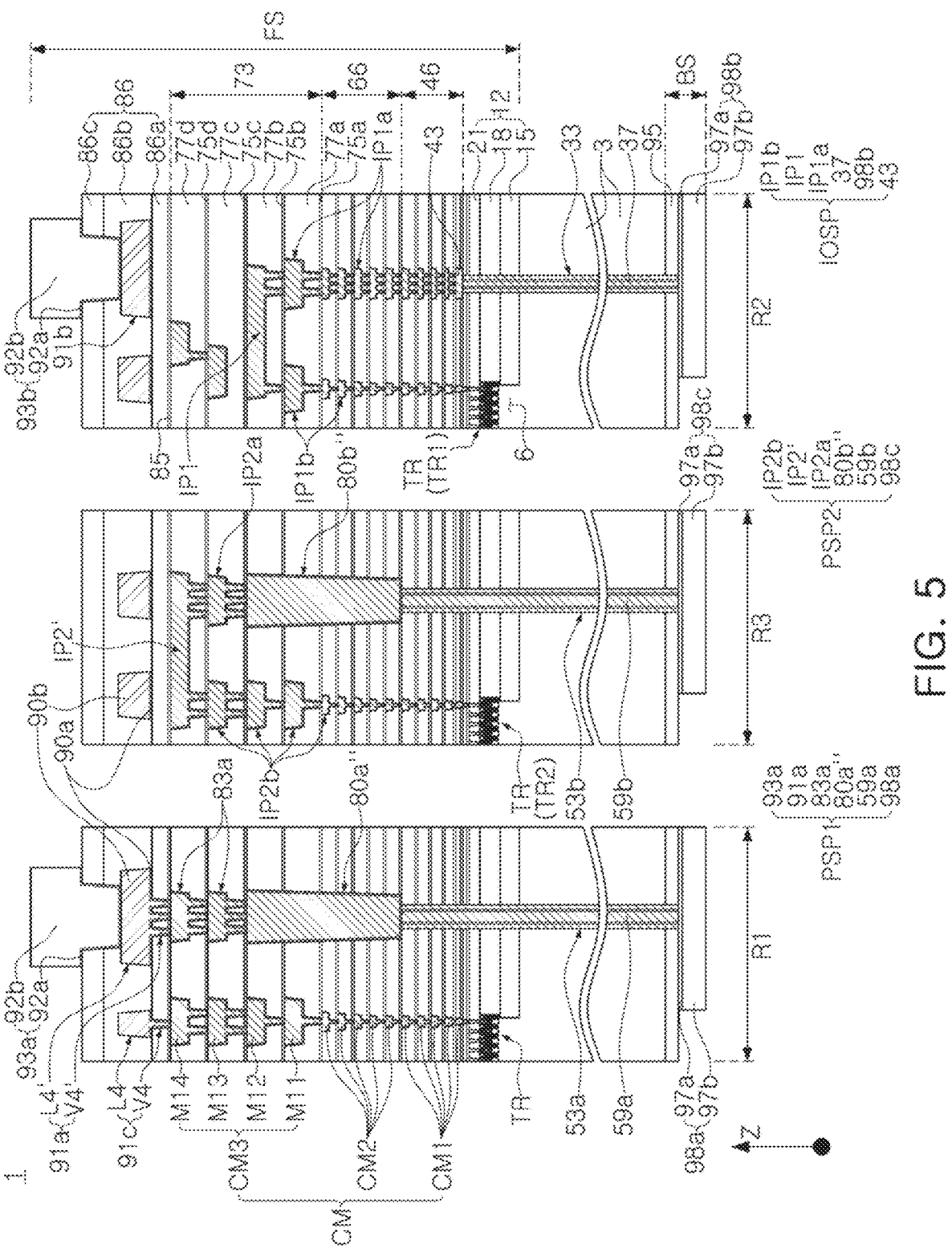
FIG. 5 is a cross-sectional diagram illustrating a semiconductor device according to an example embodiment of the present disclosure.

In the modified example, referring to FIG. 5, the first front side conductive pattern 80*a* and the third front side conductive pattern 80*b* described with reference to FIGS. 1 and 2A may be replaced with a first front side conductive pattern 80*a''* and a third front side conductive pattern 80*b''* penetrating through at least two of the third inter-metal dielectric layers 77*a*, 77*b*, 77*c*, and 77*d* of the third insulating structure 73. For example, each of the first and third front side conductive patterns 80*a''* and 80*b''* may penetrate a lowermost third inter-metal dielectric 77*a* and a second-lowermost third inter-metal dielectric layer 77*b* among the third inter-metal dielectric layers 77*a*, 77*b*, 77*c* and 77*d*. Each of the first and third front side conductive patterns 80*a''* and 80*b''* may penetrate the lowermost third inter-metal dielectric layer 77*a* and the second-lowermost third inter-metal dielectric layer 77*b* and may penetrate a lowermost third insulating barrier layer 75*a* and a second-lowermost third insulating barrier layer 75*b* among the third insulating barrier layers 75*b*, 75*c*, 75*d*, and 7. Upper surfaces of the first front side conductive pattern 80*a* and the third front side conductive pattern 80*b* may be coplanar with an upper surface of the twelfth circuit interconnection pattern M12.

Figure 6:
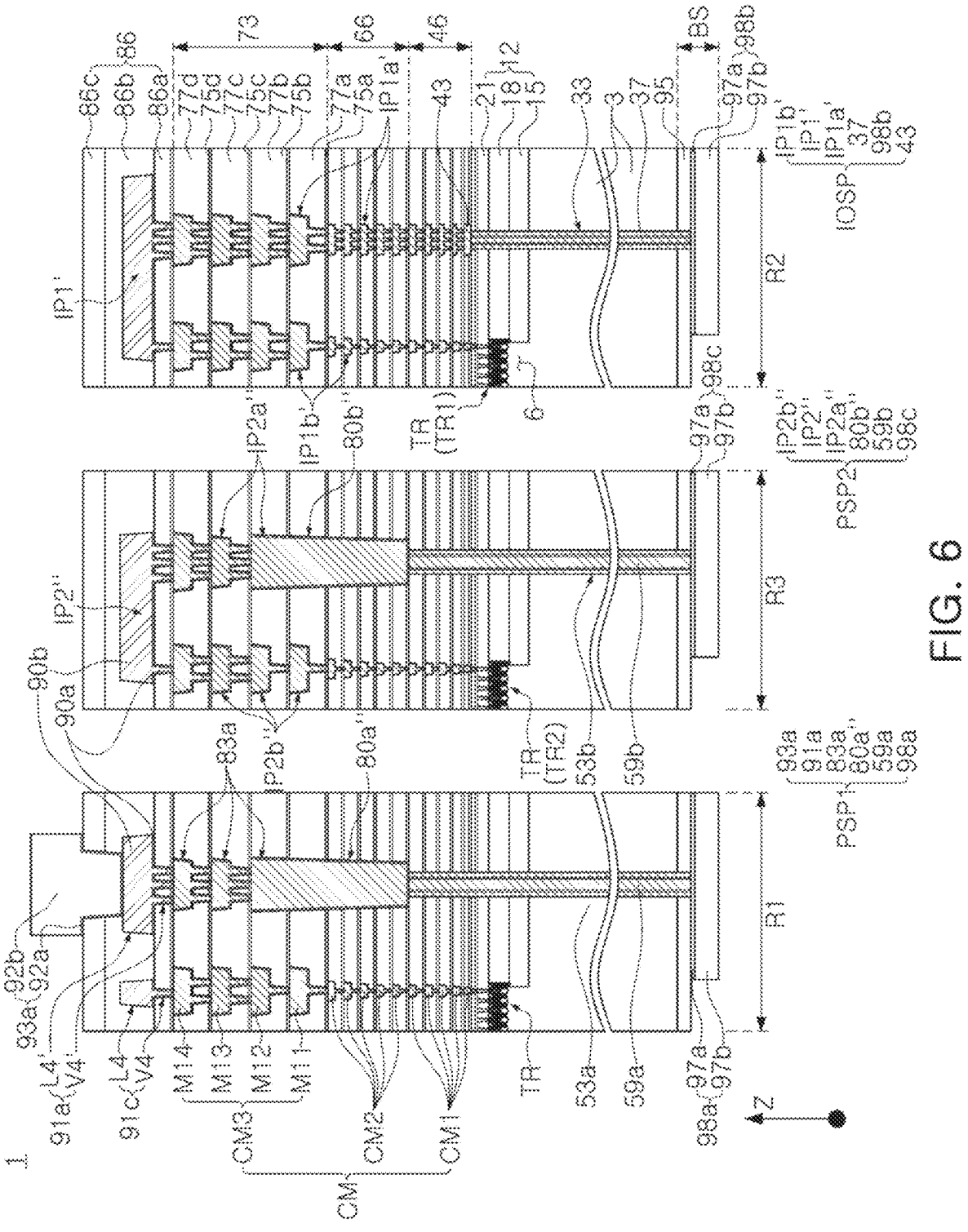
FIG. 6 is a cross-sectional diagram illustrating a semiconductor device according to an example embodiment of the present disclosure.

In the modified example, referring to FIG. 6, the first bridge pattern IP1 (in FIG. 1) described in FIG. 1 may be replaced with a first bridge pattern IP1' disposed on substantially the same level as a level of the upper circuit interconnection pattern 91*c*. Accordingly, the second through electrode 37 and the second conductive pattern 43 may be electrically connected to the circuit device TR1 through second lower connection patterns IP1a' on the second conductive pattern 43, the first bridge pattern IP1' on the second lower connection patterns IP1a', and a first circuit interconnection structure IP1b' disposed below the first bridge pattern IP1'. The second back side conductive pattern 98*b*, the second through electrode 37, the second front side conductive pattern 43, the second lower connection patterns IP1a', the first bridge pattern IP1' and the first circuit interconnection structure IP1b may form an input/output signal path IOSP.

The second bridge pattern IP2 (in FIG. 1) described with reference to FIG. 1 may be replaced with a second bridge pattern IP2' disposed on substantially the same level as the level of the upper circuit interconnection pattern 91*c*. Accordingly, the third through electrode 59*b* and the third conductive pattern (80*b* in FIG. 1 or 80*b*' in FIG. 5) may be electrically connected to the circuit device TR2 through the third lower connection patterns IP2a' on the third conductive pattern (80*b* in FIG. 1 or 80*b*' in FIG. 5), the second bridge pattern IP2' on the third lower connection patterns IP2a', and a second circuit interconnection structure IP2b' disposed below the second bridge pattern IP2'. The third back side conductive pattern 98*c*, the third through electrode 59*b*, the third front side conductive pattern (80*b* in FIG. 1 or 80*b*' in FIG. 5), the third lower connection patterns IP2a', the second bridge pattern IP2' and the second circuit interconnection structure IP2b' may form a second power path PSP2.

Figure 7:
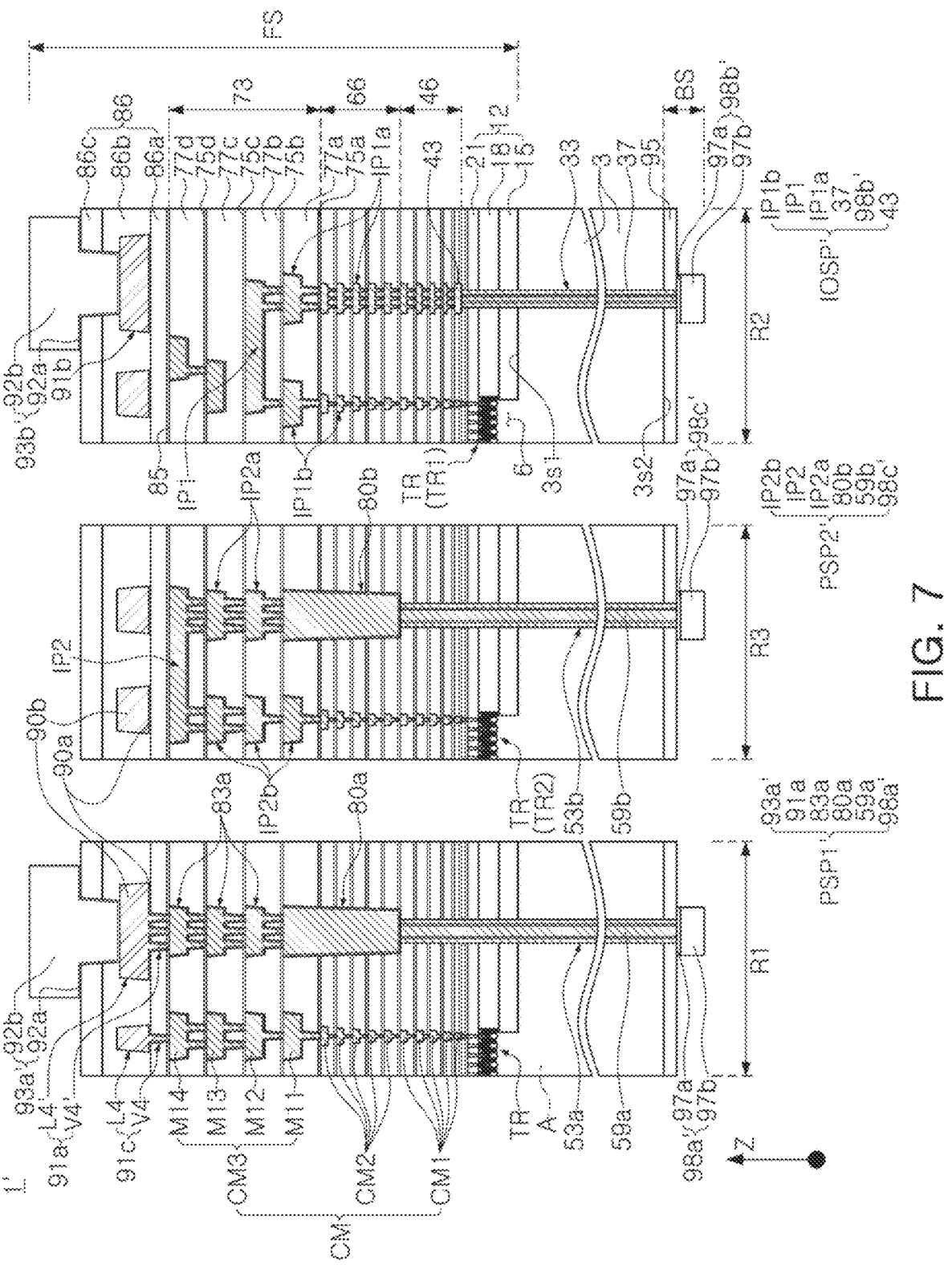
FIG. 7 is a cross-sectional diagram illustrating a semiconductor device according to an example embodiment of the present disclosure.

In the modified example, referring to FIG. 7, a semiconductor device 1' may include first to third lower conductive patterns 98*a*, 98*b*, and 98*c* which may replace the first to third lower conductive patterns 98*a*, 98*b*, and 98*c* described with reference to FIG. 1 and first and second front side pads 93*a*' and 93*b*' which may replace the first and second front side pads 93*a* and 93*b* described with reference to FIG. 1, respectively. A width of each of the first and second front side pads 93*a*' and 93*b*' may be greater than a width of each of the first to third lower conductive patterns 98*a*', 98*b*', and 98*c*'.

Figure 8A:
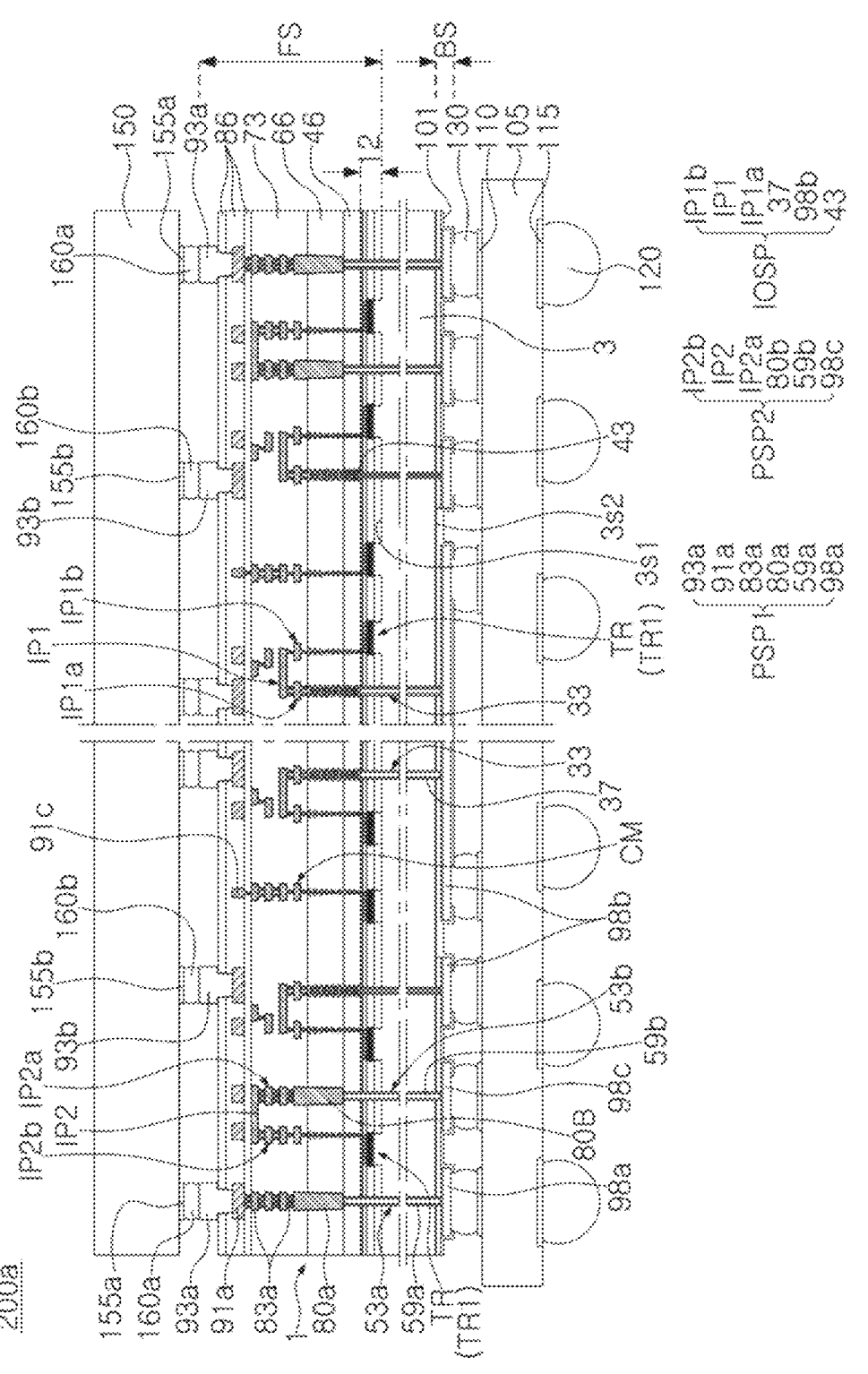
FIG. 8A is a cross-sectional diagram illustrating a semiconductor device according to an example embodiment of the present disclosure.

In the description below, a semiconductor package including the semiconductor device described in the aforementioned example embodiment will be described with reference to FIGS. 8A and 8B. FIG. 8A is a cross-sectional diagram illustrating an example of a semiconductor package including the semiconductor device described above, and FIG. 8B is a cross-sectional diagram illustrating another example of the semiconductor package including the semiconductor device described above.

In an example, referring to FIG. 8A, a semiconductor package 200*a* may include a base substrate 105, a first semiconductor device 1 on the base substrate 105, a second semiconductor device 150 on the first semiconductor device 1, first connection patterns 130 electrically connecting the base substrate 105 to the first semiconductor device 1 between the base substrate 105 and the first semiconductor device 1, and second connection patterns 160*a* and 160*b* electrically connecting the first semiconductor device 1 to the second semiconductor device 150 between the first semiconductor device 1 and the second semiconductor device 150. The semiconductor package 200*a* may further include solder balls 120 disposed below the base substrate 105.

The first semiconductor device 1 may include processing circuitry such as a microprocessor, a central processor unit (CPU), a graphics processing unit (GPU), an application processor (AP), or the like, or a logic chip such as a field programmable gate array (FPGA), an application-specific IC (ASIC), or the like.

The second semiconductor device 150 may include at least one of a logic chip, a memory chip, and a sensor chip. For example, the second semiconductor device 150 may include processing circuitry, such as a microprocessor, a central processor unit (CPU), a graphic processor unit (GPU), an application processor (AP), or the like, or a logic chip such as a field programmable gate array (FPGA), an application-specific (ASIC), or the like, or a memory chip. The memory chip may be a volatile memory chip or a non-volatile memory chip. For example, the volatile memory chip may include a dynamic random access memory (DRAM), a static RAM (SRAM), a thyristor RAM (TRAM), a zero capacitor RAM (ZRAM), or a twin transistor RAM (TTRAM). Also, the non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano floating gate memory, a holographic memory, a molecular electronics memory, or an insulator resistance change memory.

The base board 105 may be implemented as a printed circuit board or an interposer board. The base substrate 105 may include pads 115 electrically connected to the sole balls 120 and pads 110 electrically connected to the first connection patterns 130.

The second semiconductor device 150 may further include pads 110 electrically connected to the second connection patterns 160*a* and 160*b*.

The first semiconductor device 1 may be the semiconductor device described in one of the aforementioned example embodiments described with reference to FIGS. 1 to 6.

In the first semiconductor device 1, a front side structure FS including the circuit device TR may oppose the second semiconductor device 150. Accordingly, in the first semiconductor device 1, the first to third back side conductive patterns 98*a*, 98*b*, and 98*c* may be electrically connected to the first connection patterns 130, and the first and second front side pads 93*a* and 93*b* may be electrically connected to the second connection patterns 160*a* and 160*b*. The first semiconductor device 1 may further include a back side protection layer 101 covering the first to third back side surface conductive patterns 98*a*, 98*b*, and 98*c*, and having openings exposing a region in which the first to third back side surface conductive patterns 98*a*, 98*b*, and 98*c* are in contact with the first connection patterns 130.

Since the first power path PSP1 described in FIG. 1 is a substantially vertical path, power loss due to power transmission may be reduced. Accordingly, loss of power transmitted from the base substrate 105 to the second semiconductor device 150 through the first power path PSP1 of the first semiconductor device 1 may be reduced. Accordingly, power may be stably provided to the second semiconductor device 150.

Figure 8B:
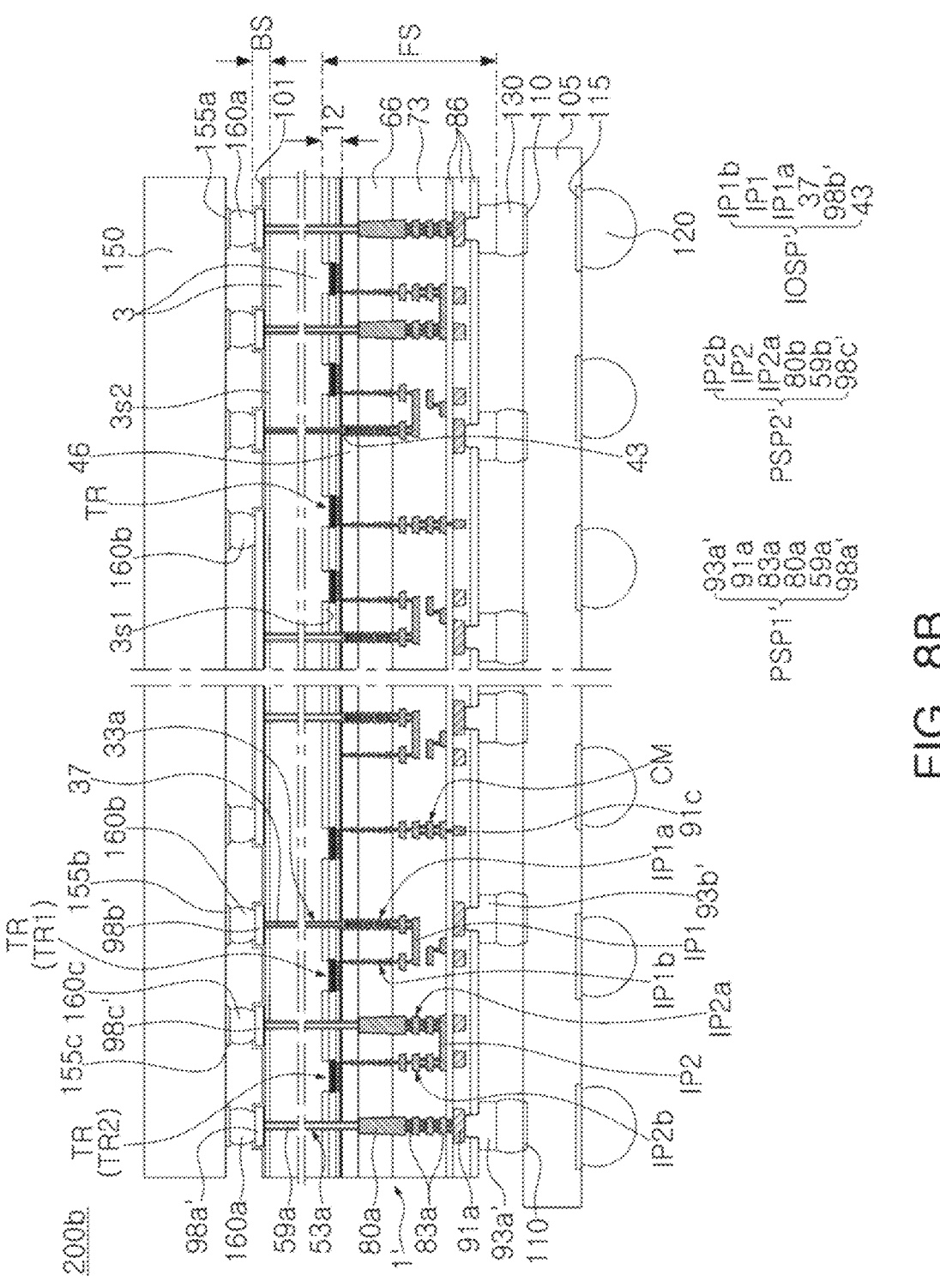
FIG. 8B is a cross-sectional diagram illustrating a semiconductor device according to an example embodiment of the present disclosure.

In another example, referring to FIG. 8B, a semiconductor package 200*a* may include a first semiconductor device 1' which may replace the first semiconductor device 1 of the semiconductor package 200a in FIG. 8A. The first semiconductor device 1 may be the semiconductor device described with reference to FIG. 7. In the first semiconductor device 1', the front side structure FS including the circuit device TR may oppose the base substrate 105. Accordingly, in the first semiconductor device 1', the first to third back side conductive patterns 98a', 98b', and 98c' may be electrically connected to the second connection patterns 160a, 160b, and 160c, and the first and second front side pads 93a' and 93b' may be electrically connected to the first connection patterns 130. The first semiconductor device 1' may further include a back side protection layer 101 covering the first to third back side conductive patterns 98a', 98b', and 98c', and having openings exposing a region in which the first to third back side conductive patterns 98a', 98b, and 98c' are in contact with the second connection patterns 160a, 160b, and 160c.

In the description below, a method of manufacturing a semiconductor device in an example embodiment will be described with reference to FIGS. 9 to 12. FIGS. 9 to 12 are cross-sectional diagrams illustrating a method of manufacturing a semiconductor device in an example embodiment. In describing the method of manufacturing a semiconductor device in an example embodiment, descriptions of the materials and thicknesses of the components described above will not be provided, and a method of forming the components described above will be mainly described.

Figure 9:
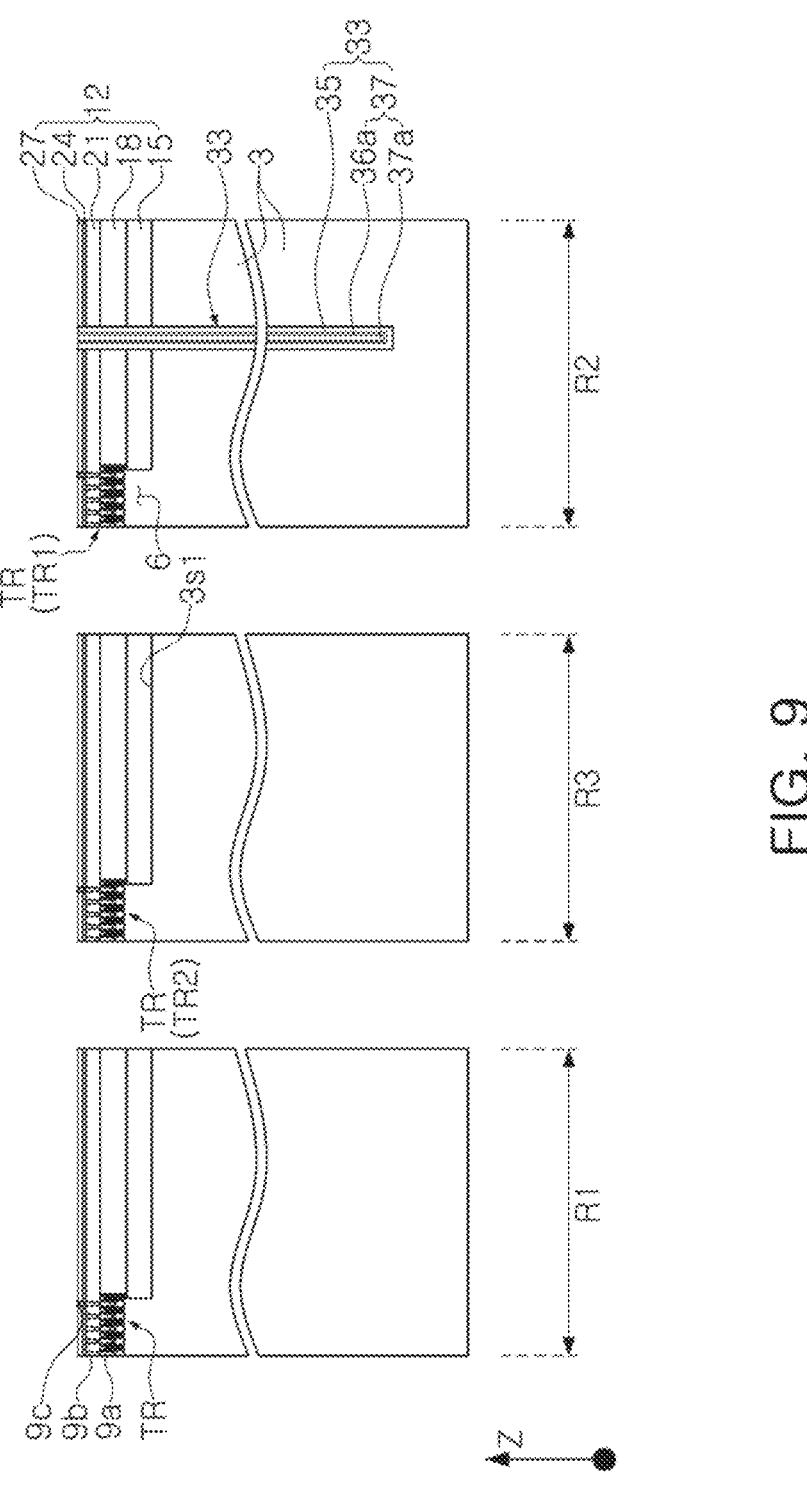
FIGS. 9 to 12 are cross-sectional diagrams illustrating a method of manufacturing a semiconductor device according to an example embodiment of the present disclosure.

Referring to FIG. 9, a first lower insulating layer 15 limiting an active region 6 may be formed on a semiconductor substrate 3. The semiconductor substrate 3 may be configured as a silicon substrate, but an example embodiment thereof is not limited thereto. For example, the semiconductor substrate 3 may be configured as a compound semiconductor substrate.

A circuit device TR and a second lower insulating layer 18 may be formed on the active region 6. The circuit device TR may be a transistor having a multi-bridge channel FET (MBCFET™) structure, which is a gate-all-around field effect transistor, a fin field effect transistor device, a MOS-FET device having a vertical channel, or a planar MOSFET device.

A first contact plug 9a electrically connected to the circuit device TR may be formed. A third lower insulating layer 21 may be formed on the circuit device TR and the second lower insulating layer 18. A second contact plug 9b penetrating through the third lower insulating layer 21 and electrically connected to the first contact plug 9a may be formed. A lower insulating barrier layer 24 and a fourth lower insulating layer 27 may be sequentially formed on the third lower insulating layer 21. The first, second, third, and fourth lower insulating layers 15, 18, 21, and 27 and the lower insulating barrier layer 24 may form a lower insulating structure 12.

A second through electrode structure 33 penetrating through the lower insulating structure 12 and extending into the semiconductor substrate 3 may be formed. The forming the second through electrode structure 33 may include forming a hole penetrating through the lower insulating structure 12 and extending into the semiconductor substrate 3, forming an insulating spacer 35 covering an inner wall of the hole, forming a conductive barrier layer 36a conformally covering the insulating spacer 35, and forming a pillar pattern 36b filling the hole on the conductive barrier layer 36a. The conductive barrier layer 36a and the pillar pattern 36b may form a second through electrode 37.

A third contact plug 9c penetrating through the lower insulating barrier layer 24 and the fourth lower insulating layer 27 and electrically connected to the second contact plug 9b may be formed. The third contact plug 9c may be formed before the second through electrode structure 33 is formed or after the second through electrode structure 33 is formed.

Figure 10:
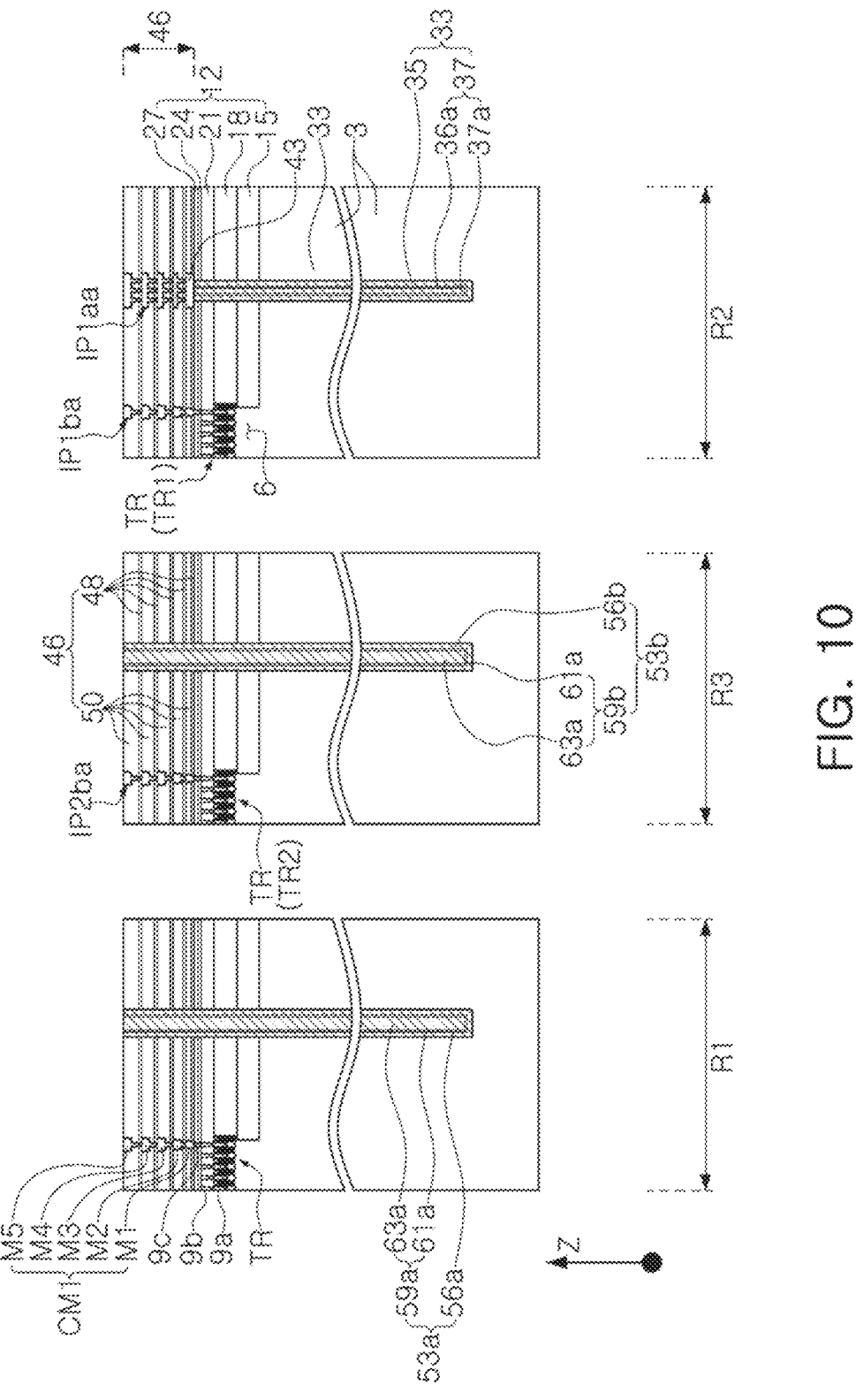

Referring to FIG. 10, a first insulating structure 46 and a first circuit interconnection structure CM1 may be formed on the lower insulating structure 12. The first insulating structure 46 may include first insulating barrier layers 48 and first inter-metal dielectric layers 50 alternately stacked on the lower insulating structure 12, and the first circuit interconnection structure CM1 may include first, second, third, fourth, and fifth circuit interconnection patterns M1, M2, M3, M4, and M5 disposed on different levels.

Forming the first circuit interconnection pattern M1 of the first circuit interconnection structure CM1 and simultaneously forming a second front side conductive pattern 43 covering the second through electrode structure 33 may be further included.

A portion IP1ba of the first circuit interconnection structure IP1b (in FIG. 1) described with reference to FIG. 1, a portion IP2ba of the second circuit interconnection structure IP2b (in FIG. 1), and a portion IP1aa of the second connection patterns IP1a in FIG. 1 may be formed simultaneously with the first circuit interconnection structure CM1.

The forming the first insulating structure 46 and the first circuit interconnection structure CM1 may include repeatedly forming a first insulating barrier layer and a first inter-metal dielectric layer stacked in order and forming an interconnection pattern by a damascene process.

First and third through electrode structures 53a and 53b may be formed. The forming the first and third through electrode structures 53a and 53b may include forming holes penetrating through the first insulating structure 46 and the lower insulating structure 12 and extending into the semiconductor substrate 3, forming insulating spacers 56a and 56b covering inner walls of the holes, forming a conductive barrier layer 61a conformally covering the insulating spacers 56a and 56b, and forming a pillar pattern 63a filling each of the holes on the conductive barrier layer 61a. The conductive barrier layer 61a and the pillar pattern 63a of the first through electrode structure 53a may form a first through electrode 59a, and the conductive barrier layer 61a and the pillar pattern 63a of the third through electrode structure 53b may form a third through electrode 59b.

Figure 11:
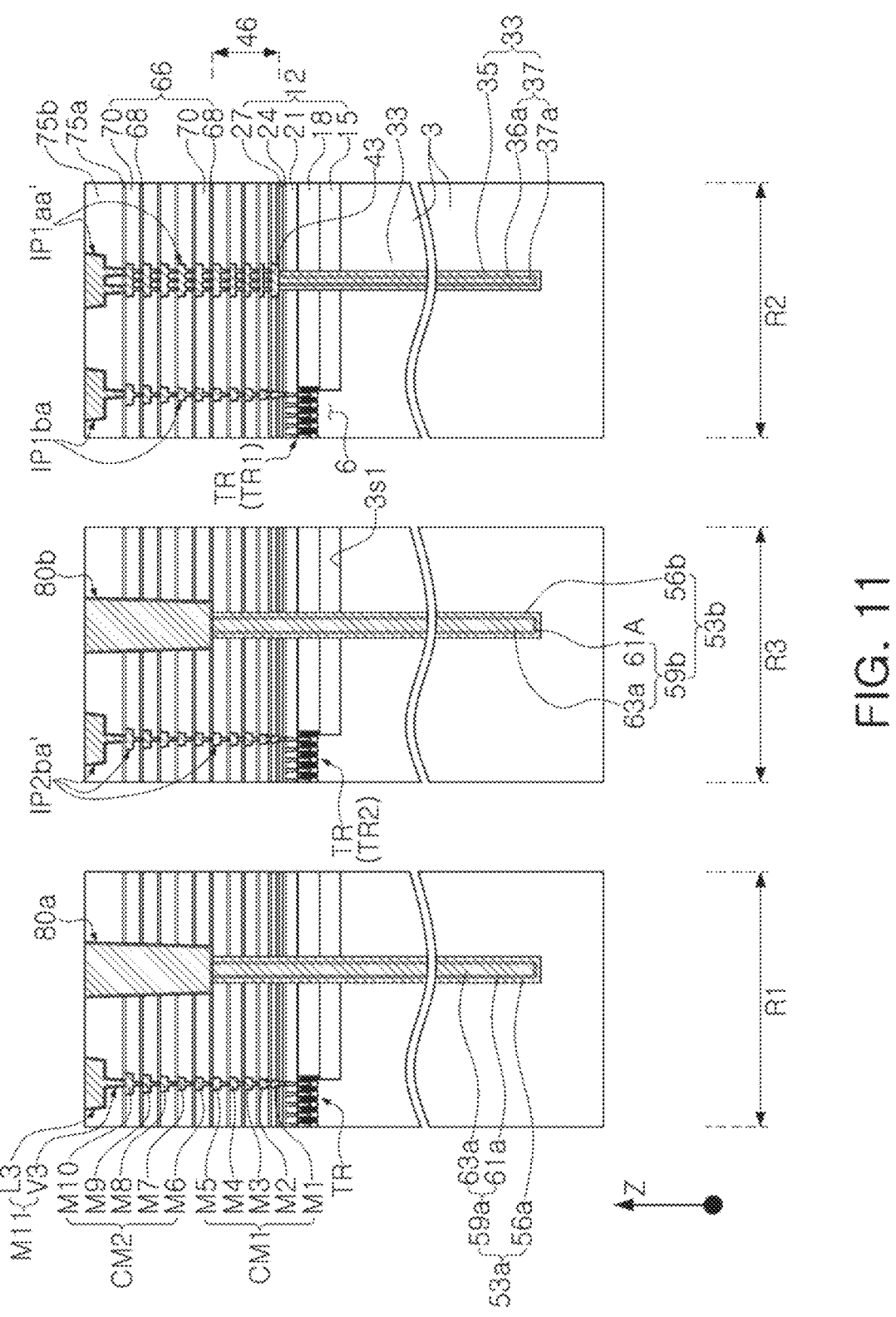

Referring to FIG. 11, a second insulating structure 66 and a second circuit interconnection structure CM2 may be formed on the first insulating structure 46. The second insulating structure 66 may include second insulating barrier layers 68 and second inter-metal dielectric layers 70 alternately stacked, and the second circuit interconnection structure CM2 may include sixth, seventh, eighth, ninth, and tenth circuit interconnection patterns M6, M7, M8, M9, and M10 disposed on different levels.

The forming the second insulating structure 66 and the second circuit interconnection structure CM2 may include repeatedly forming a second insulating barrier layer and a second inter-metal dielectric layer stacked in order, and forming an interconnection pattern by a damascene process.

A third insulating barrier layer 75a and a third inter-metal dielectric layer 75b may be formed, and an eleventh circuit interconnection pattern M11 may be formed in the third insulating barrier layer 75a and the third inter-metal dielectric layer 75b through a damascene process.

A portion IP1ba' of the first circuit interconnection structure IP1b (in FIG. 1) described with reference to FIG. 1, a portion IP2ba' of the second circuit interconnection structure IP2b (in FIG. 1), and a portion IP1aa' of the second connection patterns IP1a (in FIG. 1) may be formed simultaneously with the first circuit interconnection structure CM1 and the eleventh circuit interconnection pattern M11.

First and third front side conductive patterns 80a and 80b may be formed. The forming the first and third front side conductive patterns 80a and 80b may include forming holes penetrating through the third insulating barrier layer 75a, the third inter-metal dielectric layer 75b, and the second insulating structure 66, and exposing the first and third through electrode structures 53a and 53b, respectively, and filling the holes with a conductive material.

Figure 12:
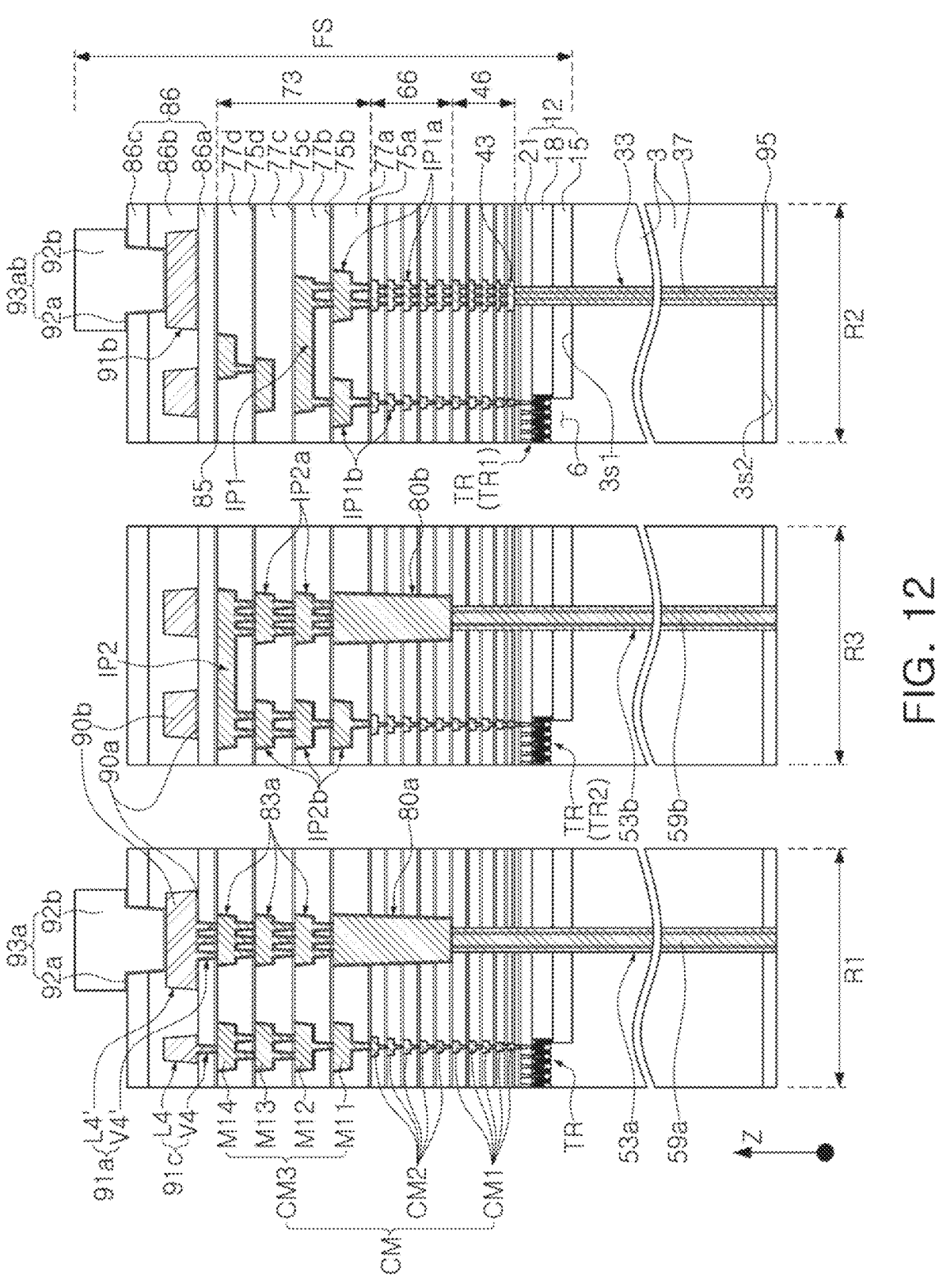

Referring to FIG. 12, an insulating structure and circuit interconnection patterns may be formed on the third inter-metal dielectric layer 75b. The forming the insulating structure and the circuit interconnection patterns on the third inter-metal dielectric layer 75b may include repeatedly forming a third insulating barrier layer and a third inter-metal dielectric layer in order, and forming a circuit interconnection pattern in the inter-metal dielectric layer by a damascene process. Accordingly, a third circuit interconnection structure CM3 including the eleventh, twelfth, thirteenth, and fourteenth circuit interconnection patterns M11, M12, M13, and M14 and a third insulating structure 73 including the third insulating barrier layers 75a, 75b, 75c, and 75d and the third inter-metal dielectric layers 77a, 77b, 77c, and 77d may be formed. Accordingly, a lower circuit interconnection structure CM including the first, second, and third circuit interconnection structures CM1, CM2, and CM3 may be formed.

An upper insulating barrier layer 85 and a first upper insulating layer 86a may be formed in order on the third insulating structure 73. Holes penetrating through the first upper insulating layer 86a may be formed, a metal layer filling the holes and covering the first upper insulating layer 86a may be formed, and first and second upper connection patterns 91a and 91b and an upper circuit interconnection pattern 91c may be formed by patterning the metal layer.

A second upper insulating layer 86b covering the first and second upper connection patterns 91a and 91b and the upper circuit interconnection pattern 91c may be formed. A third upper insulating layer 86c may be formed on the second upper insulating layer 86b. The first to third upper insulating layers 86a, 86b and 86c may form an upper insulating structure 86.

First and second front side pads 93a and 93b penetrating through the third and second upper insulating layers 86c and 86b and in contact with the first and second upper connection patterns 91a and 91b, respectively, may be formed. Each of the first and second front side pads 93a and 93b may include a liner layer 92a and a pad pattern 92b on the liner layer 92a.

A back side surface of the semiconductor substrate 3 may be ground and etched such that the first to third through electrode structures 53a, 33, and 53b may protrude from the second surface 3s2 of the semiconductor substrate 3.

A back side insulating layer 95 covering the second surface 3s2 of the semiconductor substrate 3 may be formed, and the first to third through electrodes 59a, 33, and 59b and the back side insulating layer 95 of the first to third through electrode structures 53a, 33, and 53b may be planarized.

Referring back to FIG. 1, first to third back side conductive patterns 98a, 98b, and 98c electrically connected to the first to third through electrodes 59a, 33, and 59b, respectively, may be formed.

According to the aforementioned example embodiments, the first through electrode 59a used as a power transmission path may be formed by a process different from the process of forming the second through electrode 37 used as an input/output signal transmission path. Therefore, since the first through electrode 59a may be formed to have a width and thickness greater than those of the second through electrode 37, resistance of the first through electrode 59a may be lower than resistance of the second through electrode 37. Accordingly, power loss due to a power transmission path in the semiconductor device 1 may be reduced.

The first through electrode 59a may extend through the semiconductor substrate 3 and may extend to the first insulating structure 46 including a low-k material, and the first front side conductive pattern 80a in contact with the first through electrode 59a may penetrate the second insulating structure 66 including at least an ultra-low-k dielectric. The first through electrode 59a having a relatively large thickness in the vertical direction Z may not penetrate the second insulating structure 66, and the first front side conductive pattern 80a having a thickness smaller than that of the first through electrode 59a in the vertical direction Z and a width greater than that of the first through electrode 59a may be configured to penetrate the second insulating structure 66 including an ultra-low-k dielectric. The structure including the first through electrode 59a and the first front side conductive pattern 80a may further reduce resistance and may reduce etching damage to the second insulating structure 66 including an ultra-low-k dielectric. Also, using the structure including the first through electrode 59a having reduced resistance and the first front side conductive pattern 80a as a power path, power loss may be reduced. Accordingly, performance of the semiconductor device 1 may improve.

According to the aforementioned example embodiments, by providing a plurality of through electrodes having various widths and various thicknesses, a semiconductor device having improved performance and a semiconductor package including the semiconductor device may be provided.

While example embodiments have been illustrated and described above, it will be apparent to those skilled in the art that modifications and variations could be made without departing from the scope of the present disclosure as defined by the appended claims.

What is claimed is:

1. A semiconductor device, comprising:
a semiconductor substrate having a first surface and a second surface opposing each other;
a front side structure on the first surface of the semiconductor substrate,
the front side structure including a circuit device including a transistor, a first front side conductive pattern at a first level, a second front side conductive pattern at a second level lower than the first level, a lower insulating structure on the first surface of the semiconductor substrate, a first insulating structure including a first inter-metal dielectric layer having a first dielectric constant less than a dielectric constant of silicon oxide on the lower insulating structure, a second insulating structure including a second inter-metal dielectric layer having a second dielectric constant less than the first dielectric constant on the first insulating structure, and a third insulating structure on the second insulating structure, and the first front side conductive pattern including a first portion penetrating through the second insulating structure and a second portion penetrating through at least a portion of the third insulating structure;

a back side structure below the second surface of the semiconductor substrate, the back side structure including a first back side conductive pattern and a second back side conductive pattern at a same level;

a first through electrode penetrating through the semiconductor substrate, the first through electrode contacting the first back side conductive pattern and the first portion of the first front side conductive pattern, the first through electrode being between the first back side conductive pattern and the first portion of the first front side conductive pattern in a vertical direction, the vertical direction being perpendicular to the first surface of the semiconductor substrate, and a width of the first through electrode being less than a width of the first portion of the first front side conductive pattern, the first through electrode including a lower portion in contact with the first back side conductive pattern and penetrating through the semiconductor substrate, a first portion of the first through electrode penetrating through the lower insulating structure, and a second portion of the first through electrode penetrating through the first insulating structure; and a second through electrode penetrating through the semiconductor substrate, the second through electrode contacting the second back side conductive pattern and the second front side conductive pattern.

2. The semiconductor device of claim 1, wherein the first inter-metal dielectric layer is among a plurality of first inter-metal dielectric layers included in the first insulating structure, wherein the second inter-metal dielectric layer is among a plurality of second inter-metal dielectric layers included in the second insulating structure, wherein the first insulating structure further includes a plurality of first insulating barrier layers, wherein the second insulating structure further includes a plurality of second insulating barrier layers, wherein the plurality of first insulating barrier layers and the plurality of first inter-metal dielectric layers are alternately stacked, wherein the plurality of second insulating barrier layers and the plurality of second inter-metal dielectric layers are alternately stacked, wherein a thickness of each of the plurality of first inter-metal dielectric layers is greater than a thickness of each of the plurality of first insulating barrier layers, and wherein a thickness of each of the plurality of second inter-metal dielectric layers is greater than a thickness of each of the plurality of second insulating barrier layers.

3. The semiconductor device of claim 2, wherein the third insulating structure includes a plurality of third insulating barrier layers and a plurality of third inter-metal dielectric layers alternately stacked on the second insulating structure, wherein each of the plurality of third inter-metal dielectric layers has a dielectric constant greater than the first dielectric constant, wherein a thickness of each of the plurality of third inter-metal dielectric layers is greater than a thickness of each of the plurality of third insulating barrier layers, and wherein the second portion of the first front side conductive pattern penetrates through at least a lowermost third insulating barrier layer among the plurality of third insulating barrier layers and at least a lowermost third inter-metal dielectric layer among the plurality of third inter-metal dielectric layers.

4. The semiconductor device of claim 3, wherein the second portion of the first front side conductive pattern penetrates through at least two of the plurality of third insulating barrier layers and at least two of the plurality of third inter-metal dielectric layers.

5. The semiconductor device of claim 3, wherein a thickness of one of the plurality of third inter-metal dielectric layers is greater than a thickness of one of the plurality of second inter-metal dielectric layers, and wherein a thickness of an uppermost second inter-metal dielectric layer among the plurality of second inter-metal dielectric layers is greater than a thickness of one of the plurality of first inter-metal dielectric layers.

6. The semiconductor device of claim 3, wherein the first insulating structure has a thickness in a range of 0.1 μm to 0.5 μm, wherein the second insulating structure has a thickness in a range of 0.5 μm to 1 μm, wherein a lowermost third inter-metal dielectric layer among the plurality of third inter-metal dielectric layers has a thickness in a range of 0.5 μm to 1.5 μm, wherein at least one of the plurality of first insulating barrier layers has a thickness in a range of 3 nm to 10 nm, and wherein at least one of the plurality of second insulating barrier layers has a thickness in a range of 50 nm to 150 nm.

7. The semiconductor device of claim 2, wherein a thickness of at least one of the plurality of second insulating barrier layers is greater than a thickness of at least one of the plurality of first insulating barrier layers.

8. The semiconductor device of claim 1, wherein the front side structure includes a plurality of first lower connection patterns, an upper insulating structure, a first upper connection pattern, and a first pad pattern, the plurality of first lower connection patterns are electrically connected to the first front side conductive pattern in the third insulating structure and stacked in order, the upper insulating structure is on the third insulating structure, the first upper connection pattern is electrically connected to the plurality of first lower connection patterns in the upper insulating structure, and the first pad pattern penetrates through at least a portion of the upper insulating structure and is electrically connected to the first upper connection pattern, wherein the first upper connection pattern includes a material different from a material of the plurality of first lower connection patterns, and wherein the first back side conductive pattern, the first through electrode, the first front side conductive pattern, the plurality of first lower connection patterns, and the first upper connection pattern overlap each other in a direction perpendicular to the first surface of the semiconductor substrate.

9. The semiconductor device of claim 8,
wherein each of the plurality of first lower connection patterns includes a first via portion and a first connection portion on the first via portion, the first connection portion extending from the first via portion on the first via portion,
wherein the first upper connection pattern includes a second via portion and a second connection portion on the second via portion, the second connection portion extending from the second via portion on the second via portion, and
wherein a slope of a side surface of the first connection portion is different from a slope of a side surface of the second connection portion.

10. The semiconductor device of claim 1,
wherein the second through electrode has a width in a range of 2.5 μm to 7 μm,
wherein the width of the first through electrode is greater than the width of the second through electrode and in a range of 3.5 μm to 9 μm,
wherein a thickness of the first front side conductive pattern is greater than a thickness of the second front side conductive pattern, and
wherein a level of the first insulating structure is higher than a level of an upper surface of the second through electrode.

11. The semiconductor device of claim 1, wherein the first front side conductive pattern is in contact with an entire upper surface of the first through electrode.

12. The semiconductor device of claim 1, further comprising:
a first insulating spacer on a side surface of the first through electrode; and
a second insulating spacer on a side surface of the second through electrode,
wherein the first through electrode includes a first pillar pattern and a first conductive barrier layer covering a side surface of the first pillar pattern,
wherein the first front side conductive pattern includes a second pillar pattern and a second conductive barrier layer covering a side surface and a bottom surface of the second pillar pattern, and
wherein the second conductive barrier layer is in contact with an upper surface of the first pillar pattern and an upper end of the first conductive barrier layer.

13. The semiconductor device of claim 1, further comprising: an insulating spacer on a side surface of the first front side conductive pattern.

14. The semiconductor device of claim 1,
wherein the lower insulating structure includes a lower insulating layer having a dielectric constant greater than the first dielectric constant,
wherein the third insulating structure includes a third inter-metal dielectric layer having a dielectric constant greater than the first dielectric constant,
wherein the second inter-metal dielectric layer is recessed by a first distance from an imaginary straight line extending from a side surface of the third inter-metal dielectric layer adjacent to or in contact with the first front side conductive pattern,
wherein the first inter-metal dielectric layer is recessed by a second distance from an imaginary straight line extending from a side surface of the lower insulating layer adjacent to the first through electrode, and wherein the first distance is greater than the second distance.

15. The semiconductor device of claim 14,
wherein the first distance is in a range of 100 nm to 300 nm, and
wherein the second distance is in a range of 10 nm to 50 nm.

16. A semiconductor device, comprising:
a semiconductor substrate having a first surface and a second surface opposing each other;
a front side structure on the first surface of the semiconductor substrate,
the front side structure including a circuit device including a transistor, a first front side conductive pattern at a first level, a second front side conductive pattern at a second level lower than the first level, and a plurality of circuit interconnection patterns at different levels;
a back side structure below the second surface of the semiconductor substrate, the back side structure including a first back side conductive pattern and a second back side conductive pattern at a same level;
a first through electrode penetrating through the semiconductor substrate, the first through electrode contacting the first back side conductive pattern and the first front side conductive pattern;
a second through electrode penetrating through the semiconductor substrate, the second through electrode contacting the second back side conductive pattern and the second front side conductive pattern, and the second through electrode having a width narrower than a width of the first through electrode,
wherein the first through electrode is between the first back side conductive pattern and the first front side conductive pattern in a vertical direction,
wherein the second through electrode is between the second back side conductive pattern and the second front side conductive pattern in the vertical direction,
wherein the vertical direction is perpendicular to the first surface of the semiconductor substrate,
wherein an upper surface of the first through electrode is at a higher level than an upper surface of the second through electrode,
wherein the plurality of circuit interconnection patterns include:
a plurality of first circuit interconnection patterns disposed at different levels from each other in the vertical direction and disposed at a lower level than the first front side conductive pattern;
a plurality of second circuit interconnection patterns disposed at different levels from each other in the vertical direction and disposed at the same level as the first front side conductive pattern; and
a plurality of third circuit interconnection patterns disposed at different levels from each other in the vertical direction and disposed at a higher level than the first front side conductive pattern, and
wherein the second front side conductive pattern is disposed at the same level as one of the plurality of first circuit interconnection patterns.

17. The semiconductor device of claim 16, further comprising:
a third through electrode,
wherein a width and a thickness of the third through electrode are equal to a width and a thickness of the first through electrode, wherein the back side structure further includes a third back side conductive pattern at the same level as a level of the first back side conductive pattern, wherein the front side structure includes a third front side conductive pattern, a plurality of first lower connection patterns, second lower connection patterns, a first bridge pattern, and a second bridge pattern, a thickness of the third front side conductive pattern is equal to a thickness of the first front side conductive pattern, a level of the third front side conductive pattern is level with the first level of the first front side conductive pattern, the plurality of first lower connection patterns are electrically connected to the first front side conductive pattern on the first front side conductive pattern and stacked in order, one or more of the second lower connection patterns are electrically connected to the second front side conductive pattern on the second front side conductive pattern, the first bridge pattern electrically connects an uppermost second lower connection pattern among the one or more of the second lower connection patterns to a first circuit interconnection pattern among the plurality of circuit interconnection patterns, and the second bridge pattern electrically connects the third front side conductive pattern to a second circuit interconnection pattern among the plurality of circuit interconnection patterns on the third front side conductive pattern, and wherein the third through electrode penetrates through the semiconductor substrate and contacts the third front side conductive pattern and the third back side conductive pattern.

18. A semiconductor package, comprising:

a base substrate;

a first semiconductor device on the base substrate, the first semiconductor device including a semiconductor substrate, a front side structure, a back side structure, a first through electrode, and a second through electrode, the semiconductor substrate having a first surface and a second surface opposing each other, the front side structure including a circuit device including a transistor, a first front side conductive pattern at a first level, a second front side conductive pattern at a second level lower than the first level, a plurality of circuit interconnection patterns at different levels, a lower insulating structure on the first surface of the semiconductor substrate, a first insulating structure including a first inter-metal dielectric layer having a first dielectric constant less than a dielectric constant of silicon oxide on the lower insulating structure, a second insulating structure including a second inter-metal dielectric layer having a second dielectric constant less than the first dielectric constant on the first insulating structure, and a third insulating structure on the second insulating structure, a thickness of the first front side conductive pattern being greater than a thickness of the second front side conductive pattern, the back side structure being below the second surface of the semiconductor substrate, the back side structure including a first back side conductive pattern and a second back side conductive pattern at a same level, the first front side conductive pattern being in contact with the first through electrode and penetrating through at least the second insulating structure, the first through electrode penetrating through the semiconductor substrate, the first through electrode contacting the first back side conductive pattern and the first front side conductive pattern, the first through electrode including a lower portion in contact with the first back side conductive pattern, a first portion of the first through electrode penetrating through the lower insulating structure, and a second portion of the first through electrode penetrating through the first insulating structure, the second through electrode penetrating through the semiconductor substrate, the second through electrode contacting the second back side conductive pattern and the second front side conductive pattern, and a width of the second through electrode being narrower than a width of the first through electrode;

a second semiconductor device on the first semiconductor device;

first connection patterns electrically connecting the base substrate to the first semiconductor device, the first connection patterns being between the base substrate and the first semiconductor device; and second connection patterns electrically connecting the first semiconductor device to the second semiconductor device, the second connection patterns being between the first semiconductor device and the second semiconductor device.

19. The semiconductor package of claim 18, wherein the second front side conductive pattern is level with a level of one of the plurality of circuit interconnection patterns, wherein at least a portion of the first front side conductive pattern is level with levels of at least two of the plurality of circuit interconnection patterns, and wherein two or more of the plurality of circuit interconnection patterns are at a level higher than the first level of the first front side conductive pattern.

20. The semiconductor package of claim 18, further comprising:

a third through electrode, wherein a width and a thickness of the third through electrode are equal to a width and a thickness of the first through electrode, wherein the back side structure further includes a third back side conductive pattern at the same level as a level of the first back side conductive pattern, wherein the front side structure further includes a third front side conductive pattern, a plurality of first lower connection patterns, second lower connection patterns, a first bridge pattern, and a second bridge pattern, a thickness of the third front side conductive pattern is equal to a thickness of the first front side conductive pattern, a level of the third front side conductive pattern is level with the first level of the first front side conductive pattern, the plurality of first lower connection patterns are electrically connected to the first front side conductive pattern and the plurality of first lower connection patterns are on the first front side conductive pattern and stacked in order, one or more of the second lower connection patterns are electrically connected to the second front side conductive pattern and on the second front side conductive pattern, the first bridge pattern electrically connects an uppermost second lower connection pattern among the one or more of the second lower connection patterns to a first circuit interconnection pattern among the plurality of circuit interconnection patterns, and the second bridge pattern electrically connects the third front side conductive pattern to a second circuit interconnection pattern among the plurality of circuit interconnection patterns on the third front side conductive pattern, wherein the third through electrode penetrates through the semiconductor substrate and contacts the third front side conductive pattern and the third back side conductive pattern, and wherein the first back side conductive pattern, the first through electrode, the first front side conductive pattern, and the plurality of first lower connection patterns overlap each other in a vertical direction perpendicular to the first surface of the semiconductor substrate.

* * * * *